United States Patent [19]

Suzuki et al.

[11] Patent Number: 5,218,753
[45] Date of Patent: Jun. 15, 1993

[54] ASSEMBLING APPARATUS USING BACK UP PINS FOR SUPPORTING PRINTED CIRCUIT BOARD

[75] Inventors: Akio Suzuki, Ota; Akihisa Iino, Oizumi; Ken-ichi Komori, Kasai; Hironobu Nakano, Fukusaki; Atsushi Hagihara, Kasai; Syozo Kawashima, Ono, all of Japan

[73] Assignee: Sanyo Electric Co., Ltd., Moriguchi, Japan

[21] Appl. No.: 919,394

[22] Filed: Jul. 29, 1992

Related U.S. Application Data

[63] Continuation of Ser. No. 540,972, Jun. 20, 1990, abandoned.

[30] Foreign Application Priority Data

Jun. 22, 1989 [JP] Japan ................................ 1-160349
Sep. 22, 1989 [JP] Japan ................................ 1-246690

[51] Int. Cl.⁵ .............................................. B23P 19/04
[52] U.S. Cl. ........................................ 29/740; 29/759; 29/760
[58] Field of Search ................ 29/407, 739, 740, 741, 29/744, 759, 760, 837, 842, 845, 846; 227/3, 104, 135

[56] References Cited

U.S. PATENT DOCUMENTS

| | | | |
|---|---|---|---|
| 3,295,189 | 1/1967 | Hammell | 29/407 X |
| 3,468,024 | 9/1969 | Yonkers | 29/407 X |
| 3,608,190 | 9/1971 | Steranko et al. | 29/760 X |
| 3,722,062 | 3/1973 | Gharaibeh | 29/739 X |
| 3,765,075 | 10/1973 | Olney, Jr. et al. | 29/739 X |
| 4,166,316 | 9/1979 | Misawa et al. | 29/845 |
| 4,598,471 | 7/1986 | Elsbree, Jr. et al. | 29/845 |
| 4,831,721 | 5/1989 | Hirai et al. | 29/740 |
| 4,868,979 | 9/1989 | Fukushima et al. | 29/740 X |
| 5,029,384 | 7/1991 | Harigane et al. | 29/760 X |

FOREIGN PATENT DOCUMENTS

| | | |
|---|---|---|
| 0157451 | 10/1985 | European Pat. Off. . |
| 0316038 | 5/1989 | European Pat. Off. . |
| 59-29492 | 2/1984 | Japan . |
| 1-117099 | 5/1989 | Japan . |

*Primary Examiner*—Mark Rosenbaum
*Assistant Examiner*—Peter Dungba Vo
*Attorney, Agent, or Firm*—Nikaido, Marmelstein, Murray & Oram

[57] ABSTRACT

An assembling apparatus includes a mounting table on which a printed circuit board is supported by back-up pins held on a base plate. The mounting table is movable in an X direction and a mounting head for mounting electronic parts on the printed circuit board is movable in a Y direction. A back-up pin stocker is provided in the vicinity of the base plate, which stores spare back-up pins being not used. A replacing unit is provided attached to the mounting head to be movable between the base plate and the back-up pin stocker together with the mounting head so that the back-up pins held on the base plate can be replaced with the back-up pins stored in the back-up pin stocker on the basis of data representative of the type of a printed circuit board, etc. by the replacing unit when the printed circuit board to be assembled is changed.

9 Claims, 39 Drawing Sheets

FIG.15
FIG.16
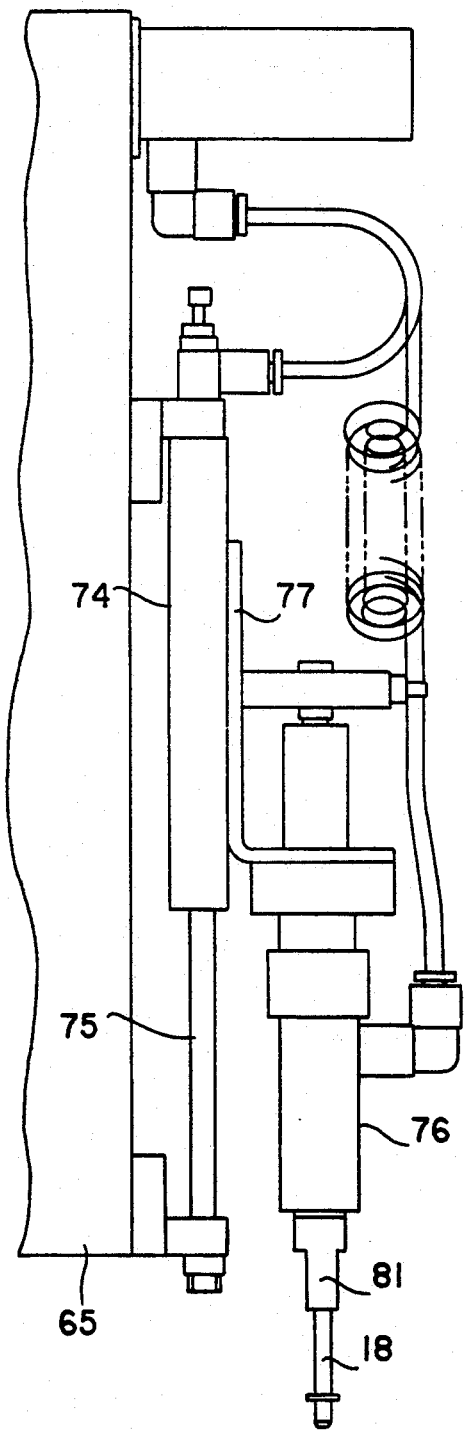
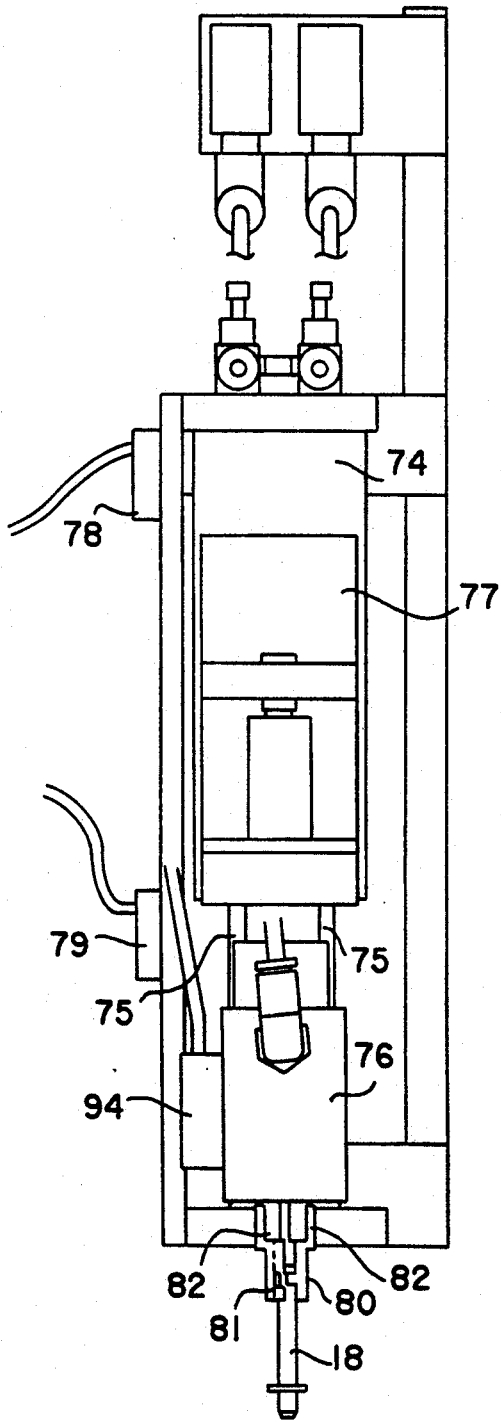

ASSEMBLING APPARATUS USING BACK UP PINS FOR SUPPORTING PRINTED CIRCUIT BOARD

This application is a continuation of application Ser. No. 07/540,972 filed Jun. 20, 1990, now abandoned.

BACKGROUND OF THE INVENTION

1. Field of the Invention

The present invention relates to an assembling apparatus using back-up pins for supporting a printed circuit board. More specifically, the present invention relates to an assembling apparatus in which electronic parts are mounted on a printed circuit board supported by back-up pins which are detachably disposed at predetermined positions in accordance with the type of the printed circuit board on a mounting table.

2. Description of the Prior Arts

In an apparatus for subjecting a printed circuit board to working such as mounting of electronic parts and application of adhesives, a printed circuit board back-up device for supporting the printed circuit board without causing flexing is required. A printed circuit board having no parts mounted or adhered on its reverse surface may be deposited on a plate-shaped supporting member but a printed circuit board having parts already mounted on its reverse surface may not. Therefore, there is a printed circuit board back-up device so constructed that a base plate is provided with a plurality of throughholes, back-up pins are detachably inserted in the throughholes, and a lot of points on the reverse surface of a printed circuit board are supported on the back-up pins. One example of the apparatus having such construction can be seen in Japanese Patent Laid-Open Gazette No. 59-29492 Feb. 16, 1984).

The above described printed circuit board back-up device is so adapted that a worker replaces back-up pins with the change in the type of a printed circuit board. The worker, therefore, must perform a work while confirming the position of each back-up pin. Accordingly, when the type of the printed circuit board is changed, the preparation takes a lot of time and labor. In addition, an error in position of the back-up pin often occurs.

In addition, an apparatus capable of solving such a problem of the conventional apparatus is disclosed in, for example, Japanese Patent Laid-open No. 1-117099 (May 9, 1989). In this prior art, when a printed circuit board to be processed is changed, the back-up pins are automatically changed by a back-up pin mounting device. More specifically, when the printed circuit board is changed, a printed circuit board positioning table on which no back-up pins are mounted is moved to the back-up pin mounting device, and the back-up pin mounting device removes unnecessary back-up pins of the back-up pins which were mounted on the positioning table for a printed circuit board which has been assembled and mounts necessary back-up pins on the positioning table for a printed circuit board to be assembled next.

However, the prior art disclosed in Japanese Patent Laid-open No. 1-117099 has a further following problems to be solved. More specifically, since the printed circuit board positioning table is moved to the back-up pin mounting device when the back-up pins are to be replaced, moving power systems for moving the positioning table requires an X direction driving system and a Y direction driving system because the back-up pin mounting device is fixed at a predetermined position. In addition, in order to select electronic parts arranged in a predetermined direction, a mount head having a suction chuck is to be moved in the predetermined direction. Therefore, in the prior art disclosed in Japanese Patent Laid-open No. 1-117099, it is necessary to provide three driving systems, and therefore, the construction becomes complex and large, and the cost becomes high.

SUMMARY OF THE INVENTION

Therefore, a principal object of the present invention is to provide a novel assembling apparatus using back-up pins for supporting a printed circuit board.

An another object of the present invention is to provide an assembling apparatus capable of saving a time and labor of a worker in replacing the back-up pins with the change in type of a printed circuit board.

The other object of the present invention is to provide an assembling apparatus in which back-up pins are automatically replaced by a back-up replacing unit.

An assembling apparatus in accordance with the present invention comprises: a mounting table on which back-up pins for supporting a printed circuit board are disposed; a stocker for stocking spare back-up pins being not used; and replacing means relatively movable between the mounting table and the stocker for replacing the back-up pins disposed on the mounting table with the back-up pins stocked by the stocker in accordance with the type of the printed circuit board.

When the printed circuit board to be assembled is changed, data representative of the type of the printed circuit board, etc. are inputted by a worker. A microcomputer or microprocessor generates NC data for replacing the back-up pins and applies the same to the replacing unit. Therefore, the back-up pins disposed on the mounting table can be automatically replaced with the back-up pins stored in the back-up pin stocker.

The replacing unit is attached to the parts mounting head to be moved together with the parts mounting head. Such a replacing unit includes, in embodiments in accordance with the invention, claws capable of grasping or sandwiching a back-up pin. When the back-up pins are to be replaced, the back-up pin inserted in a throughhole or opening formed on a base plate of the mounting table is grasped by the claws of the replacing unit, and the replacing unit is moved to the stocker while the back-up pin is pulled-out and held by the claws, and thereafter, the replacing unit inserts the back-up pin held by the claws into a throughhole or opening formed in the stocker. A back-up pin which is stocked in the stocker and to be newly used is grasped by the claws of the replacing unit to be pulled-out, and the replacing unit is moved to the base plate while the back-up pin pulled-out is held by the claws, and thereafter, the replacing unit inserts the back-up pin held by the claws into a throughholes or opening determined by the type of the printed circuit board to be assembled next of the base plate of the mounting table.

In addition such sequence for replacing the back-up pins may be reversed.

In accordance with the present invention, since a worker need not perform troublesome replacing work of the back-up pins, it is possible to reduce time for preparation when a printed circuit board to be assembled is changed and to eliminate an error in replacing the back-up pins. In addition, since the back-up pin replacing unit is attached to the mounting head for feeding electric parts to the printed circuit board to be moved together with the mounting head, it is not necessary an independent driving system for driving the replacing unit, and therefore, the construction becomes simple and small, and the cost becomes low in comparison with the prior art disclosed in Japanese Patent Laid-open No. 1-117099.

The objects and other objects, features, aspects and advantages of the present invention will become more apparent from the following detailed description of the embodiments of the present invention when taken in conjunction with accompanying drawings.

BRIEF DESCRIPTION OF THE DRAWINGS

FIG. 15 is a side elevational view showing the back-up pin replacing unit.

FIG. 16 is a front view showing the back-up pin replacing unit.

DETAIL DESCRIPTION OF THE PREFERRED EMBODIMENTS

Figure 1:
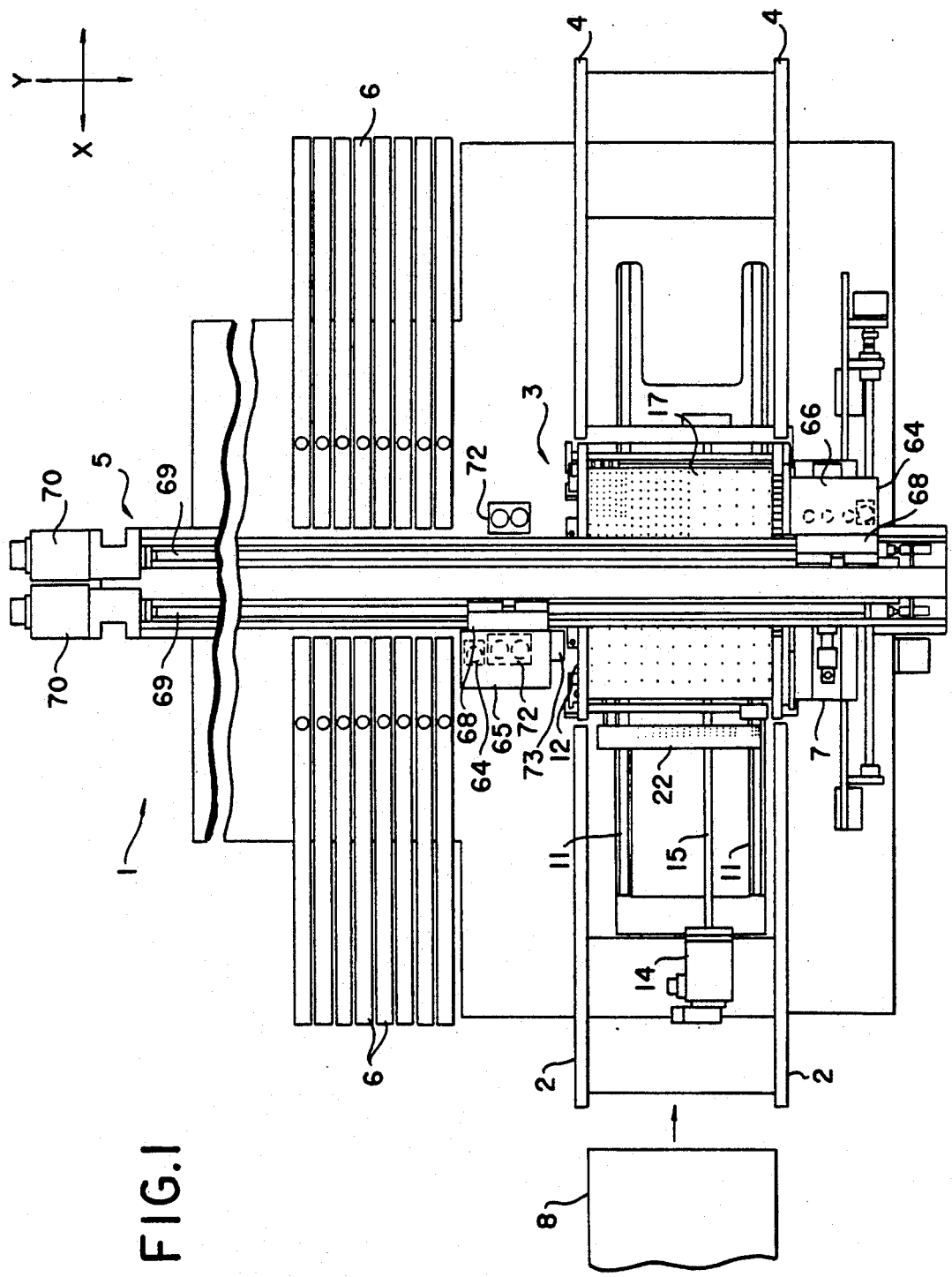
FIG. 1 is a plan view showing a parts mounting apparatus which is a first embodiment in accordance with the present invention.
Figure 2:
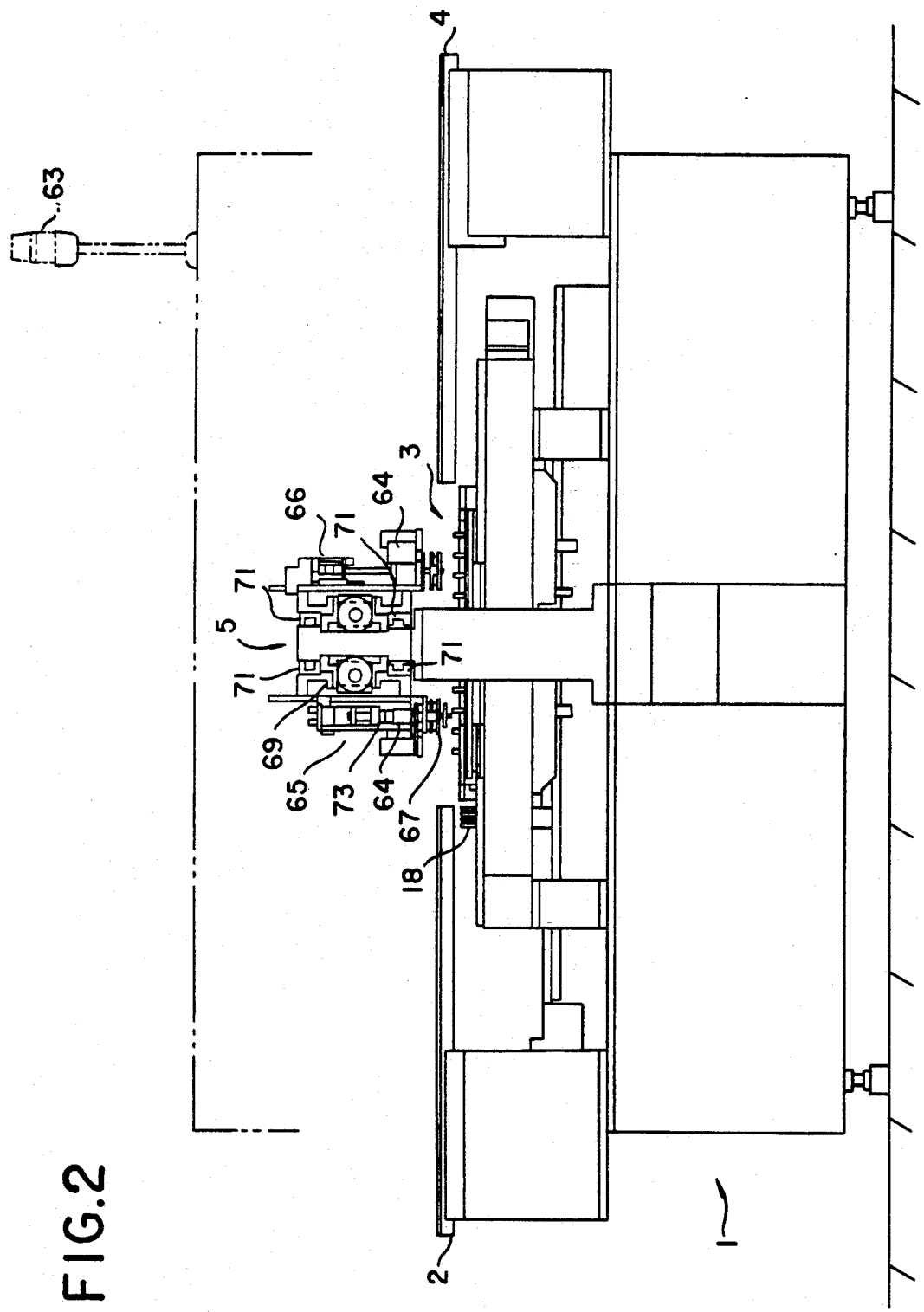
FIG. 2 is a front view showing the parts mounting apparatus of the first embodiment.
Figure 3:
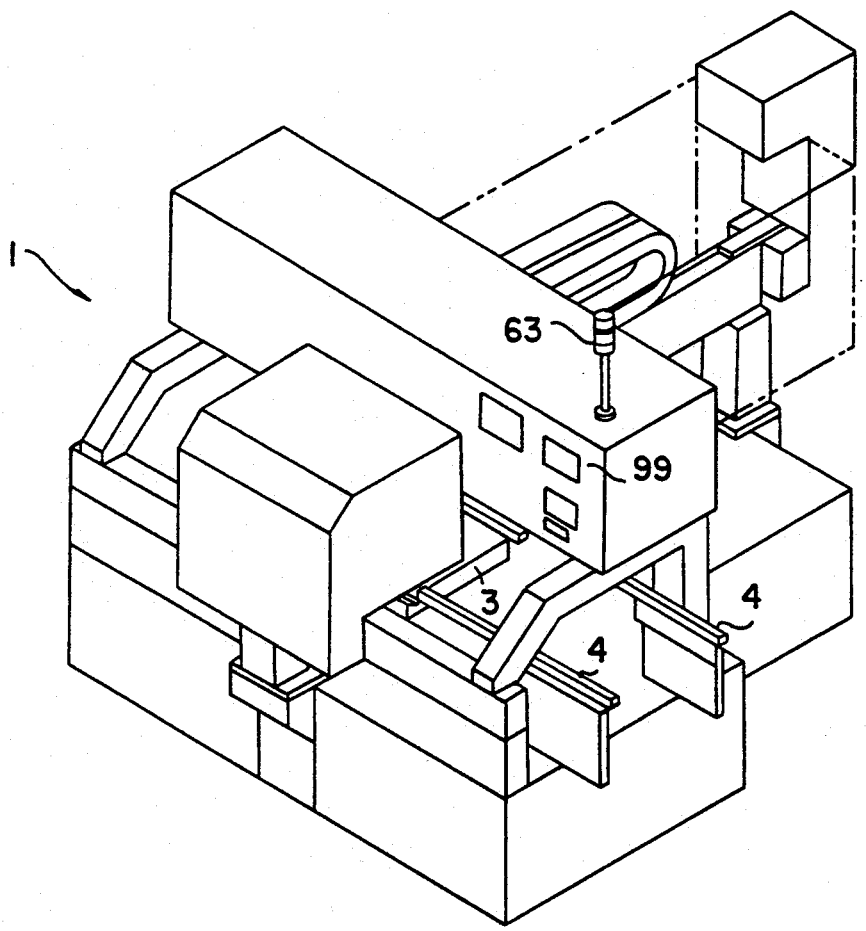
FIG. 3 is a perspective view showing the parts mounting apparatus of the first embodiment.

In FIGS. 1 to 3, the reference numeral 1 designates a parts mounting apparatus serving as a printed circuit board assembling apparatus to which the present invention can be applied. The reference numerals 2 designate a pair of feed conveyers, the reference numeral 3 designates an X table portion, and the reference numerals 4 designate a pair of discharge conveyers. The reference numeral 5 designates a Y head portion, and the reference numerals 6 designate tape feeders for feeding chip parts (not shown) contained in a tape. The reference numeral 7 designates a nozzle housing portion.

The above described feed conveyers 2 are used for conveying a printed circuit board 8 to feed the printed circuit board 8 to the X table portion 3. The width between the feed conveyers 2 can be varied depending on the size of the printed circuit board 8. The discharge conveyers 4 are used for conveying the printed circuit board 8 discharged from the X table portion 3. The width between the discharge conveyers 4 can be varied depending on the size of the printed circuit board 8.

The above described X table portion 3 will be described in detail.

Figure 4:
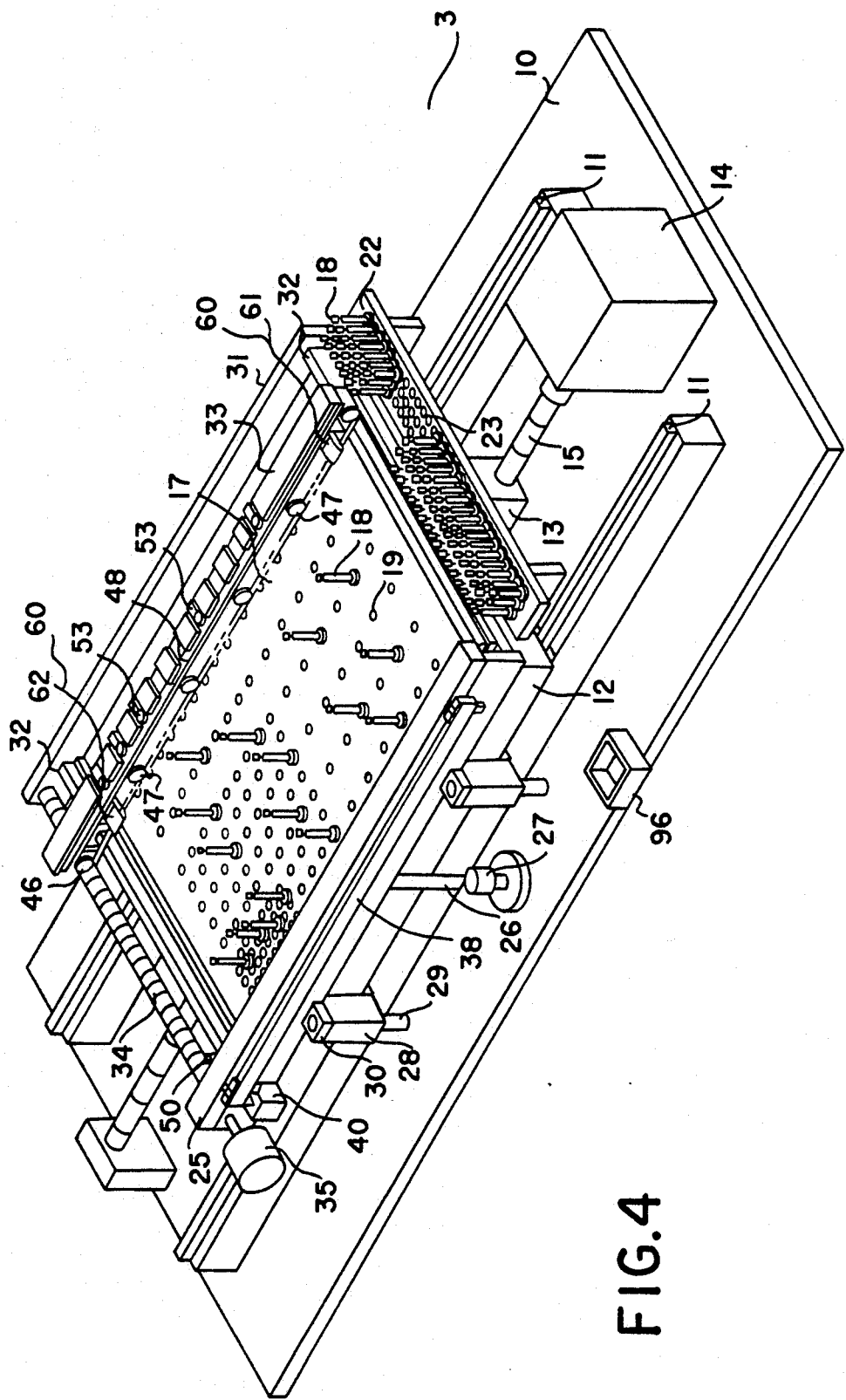
FIG. 4 is a perspective view showing an X table portion.
Figure 5:
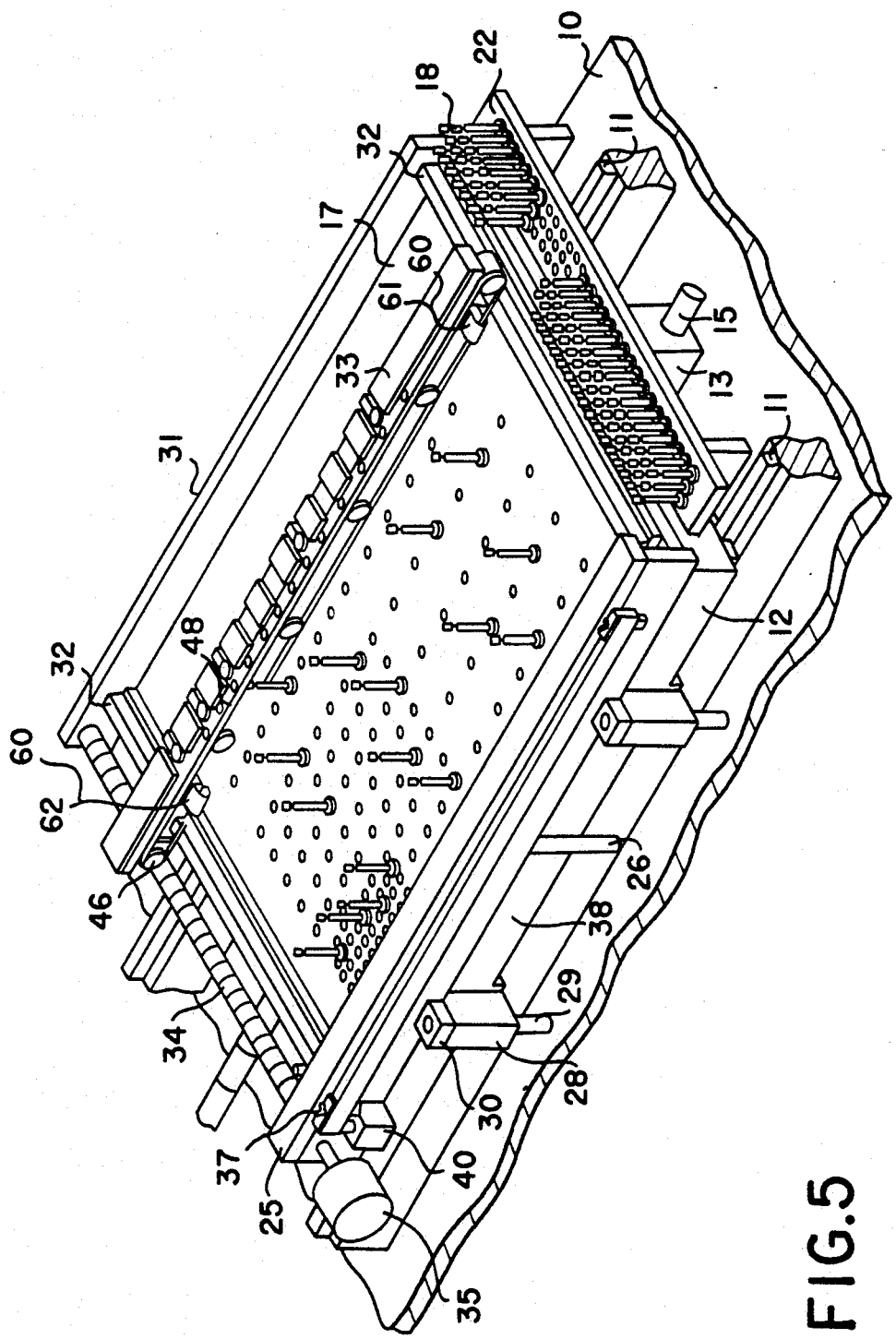
FIG. 5 is a perspective view showing an X table portion in which a light projecting and receiving sensor senses a back-up pin.
Figure 8:
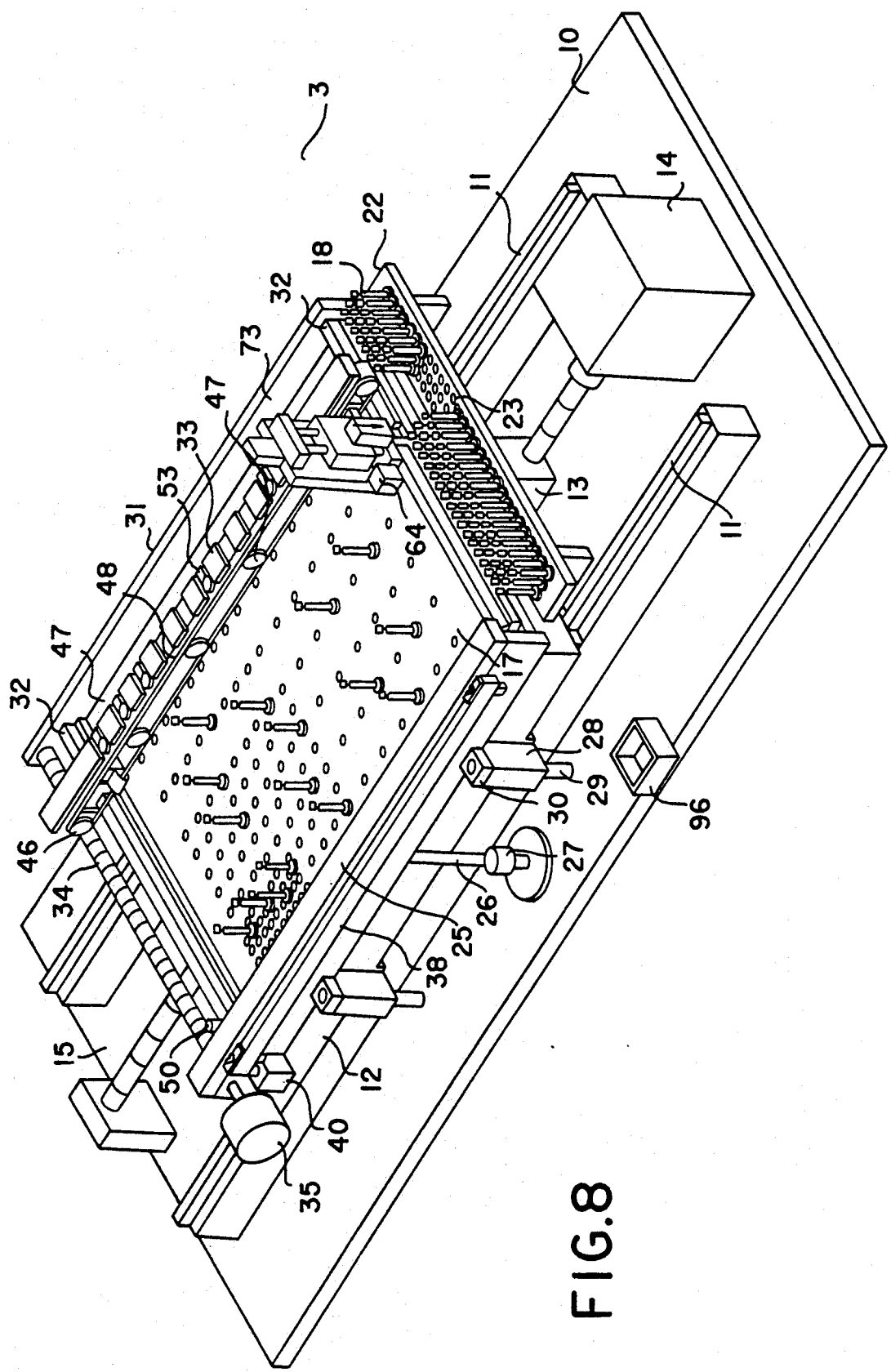
FIG. 8 is a perspective view showing an X table portion in which a back-up pin replacing unit is depicted.

In FIGS. 4, 5 and 8, the reference numeral 10 designates a base stand, the reference numerals 11 designate a pair of linear guides for moving a table which is located on the base stand 10. The reference numeral 12 designates an X table which is guided by the table moving linear guides 11 to be moved in an X direction. A nut 13 is attached to a lower part of the X table 12. The reference numeral 14 designates an X table motor mounted on the base stand 10, which rotates an X ball screw 15. The ball screw 15 is fitted to the nut 13. If the X ball screw 15 is rotated by the X table motor 14, the X table 12 is moved along the table moving linear guides 11.

The reference numeral 17 designates a board base mounted on the X table 12, which has throughholes or openings 19 in which back-up pins 18 are detachably disposed provided over its upper surface. Each of the back-up pins 18 is provided with a collar 20 larger than a diameter of the opening 19 of the board base 17 at a predetermined distance from the upper end of the back-up pin 18, as shown in FIGS. 12, 20 and 24 to 38.

Figure 12:
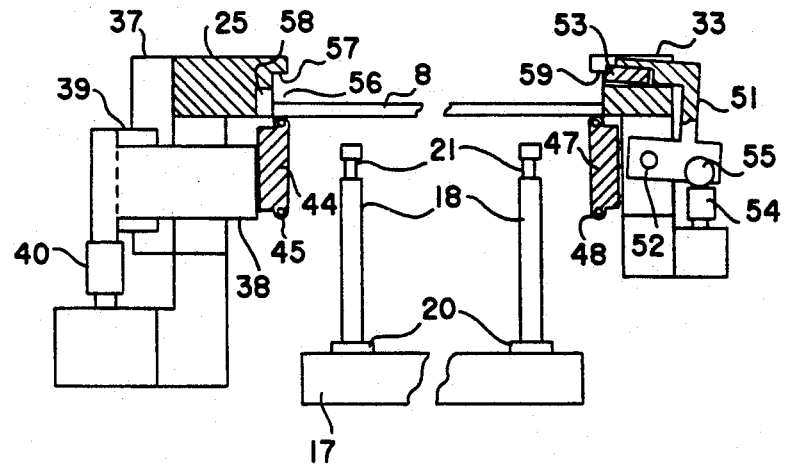
FIGS. 12 to 14 are cross sectional views showing the processes of the first embodiment in which the printed circuit board is positioned, which are viewed in the direction where the printed circuit board is conveyed.

The back-up pins 18 disposed in the openings 19 of the board base 17 are supported on the board base 17 by the collars 20, the heights of their upper end surfaces being constant. Thus, the back-up pins 18 support the printed circuit board 8. In addition, reduced diameter portions 21 are formed in the vicinity of the upper ends of the back-up pins 18, as shown in FIG. 12. The back-up pin 18 is made in several types of lengths (the length of the back-up pin 18 means the distance from the collar 20 to the upper end thereof) depending on the thickness of the printed circuit board 8. However, the reduced diameter portion 21 is positioned at a constant distance from the collar 20 irrespective of the length of the back-up pin 18.

The reference numeral 22 designates a back-up pin stocker (referred to as a B/P stocker hereinafter) attached adjacent to the X table 12, which is provided with a lot of housing openings 23 in which the back-up pins 18 are detachably disposed and contained. A region where the back-up pins 18 are stocked differs depending on the type of the back-up pins 18. The upper surface of the B/P stocker 22 is at almost the same height as that of the upper surface of the board base 17. It is also possible to provide on the board base 17 a region where the printed circuit board 8 is not supported and use the region as the B/P stocker 22.

In FIGS. 4 to 8, the reference numeral 25 designates a fixed chute which is provided with an up-and-down pin 26 in its lower part, and the reference numeral 27 designates a cylinder for raising and lowering the chute, which is provided on the base stand 10. The reference numerals 28 designate guide bodies which are attached to the X table 12, the reference numerals 29 designate slide pins which are slid and moved up and down in the guide bodies 28. The slide pins 29 are attached to the fixed chute 25 through mounting pieces 30.

Figure 6:
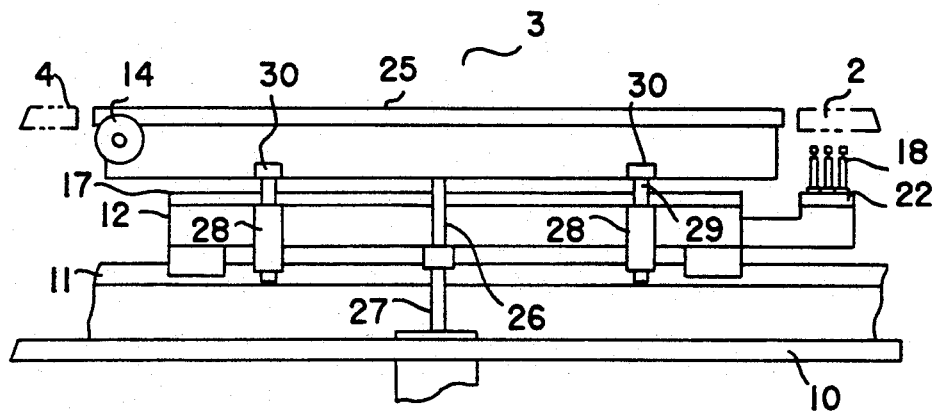
FIG. 6 is a front view showing an X table portion in which a fixed chute is raised.
Figure 7:
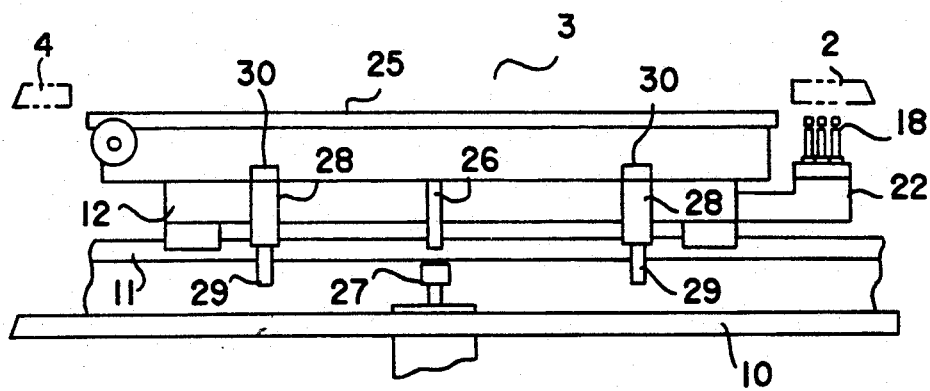
FIG. 7 is a front view showing an X table portion in which the fixed chute is lowered.

As shown in FIGS. 6 and 7, when the X table 12 is guided by the table moving linear guide 11 to be moved so that the up-and-down pin 26 is positioned in the upper part of the chute raising and lowering cylinder 27, the fixed chute 25 is guided by the guide bodies 28 to be moved up and down by the vertical motion of the cylinder 27.

The reference numeral 31 designates a supporting plate which is moved up and down by the same mechanism as that in the case of the fixed chute 25 as shown in FIGS. 6 and 7. The fixed chute 25 and the supporting plate 31 are moved up and down simultaneously and at the same height.

The reference numerals 32 designate a pair of linear guides for a movable chute constructed between the fixed chute 25 and the supporting plate 31, and the reference numeral 33 designates a movable chute which is guided by the linear guides 32 to be moved. The reference numeral 34 designates a ball screw constructed between the fixed chute 25 and the supporting plate 31, which is driven by a chute moving motor 35 to be rotated, to move the movable chute 33 through a nut (not shown) fitted to the ball screw 34 and attached to the movable chute 33.

In FIGS. 4, 5, 8 and 12 to 14, the reference numeral 37 designates a linear guide which is attached to fixed chute 25, the reference numeral 38 designates a clamp block having a moving body 39 which is moved up and down along the linear guide 37. The reference numeral 40 designates a clamping cylinder which is attached to the fixed chute 25 for moving the clamp block 38 up and down along the linear guide 37.

Figure 9:
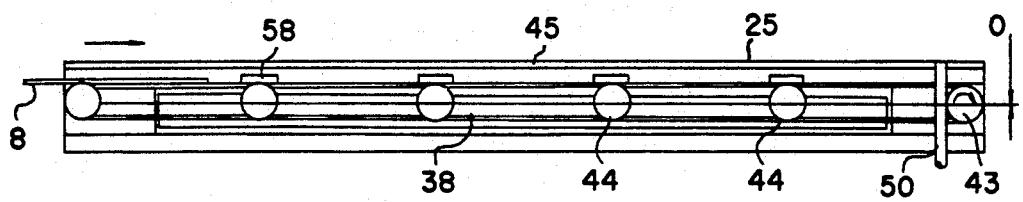
FIGS. 9 to 11 are side elevational views showing the processes of the first embodiment in which the fixed chute conveys a printed circuit board to position the same.
Figure 14:
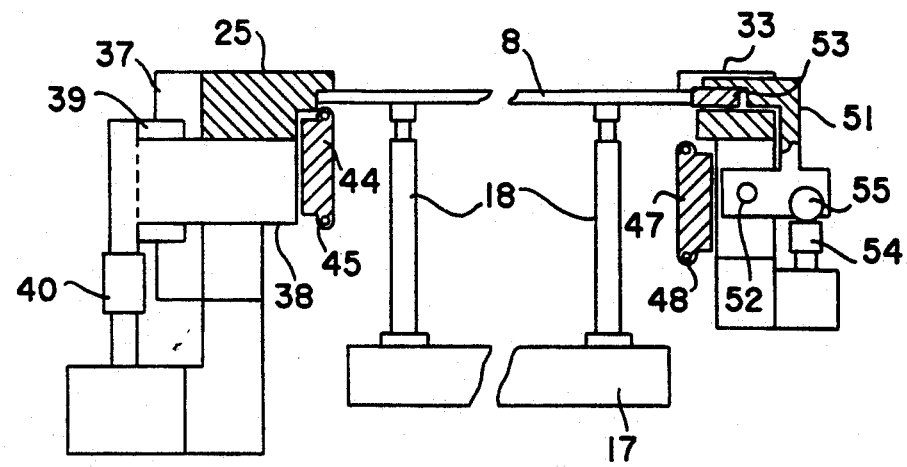
Figure 17:
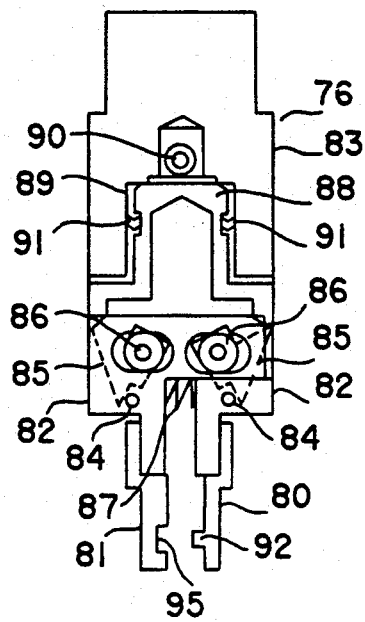
FIG. 17 is a cross sectional and broken view showing a silky chuck viewed from the front in the first embodiment.
Figure 18:
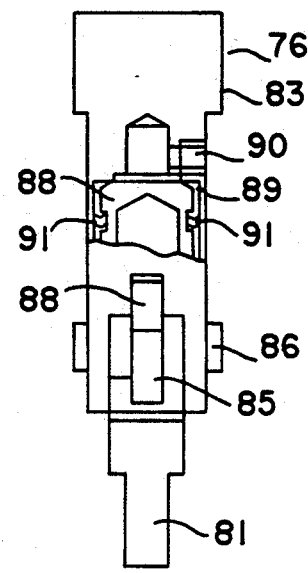
FIG. 18 is a cross sectional and broken view showing the silky chuck viewed from the side.
Figure 19:
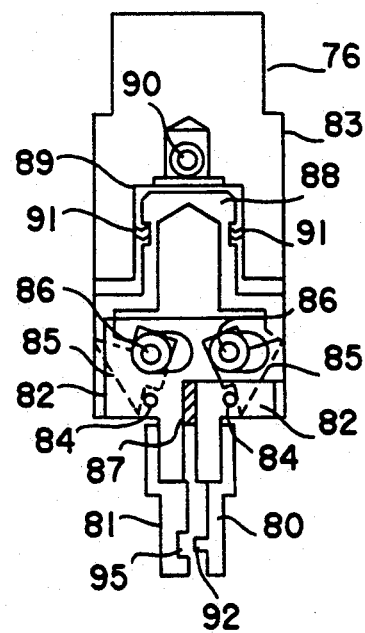
FIG. 19 is a cross sectional and broken view showing the silky chuck viewed from the front.
Figure 20:
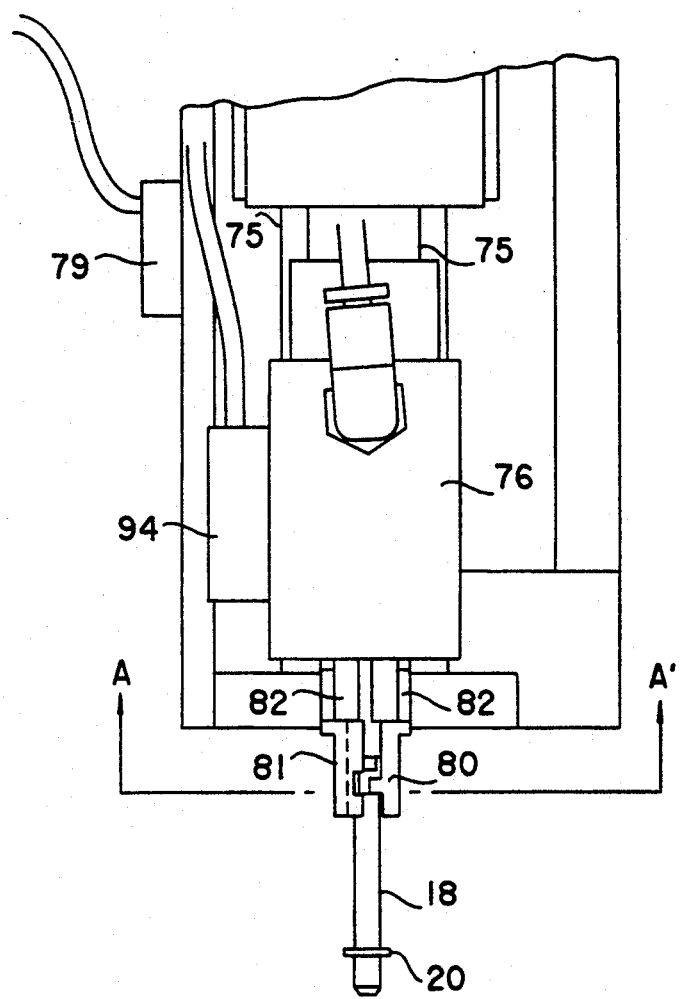
FIG. 20 is a front view showing portions in the vicinity of the silky chuck in the back-up pin replacing unit of the first embodiment.

In FIGS. 9 and 14, the reference numeral 43 designates a first driving pulley which is driven by a drive motor (not shown) attached to the fixed chute 25, and the reference numerals 44 designate clamping pulleys which are attached to the clamp block 38. The reference numeral 45 designates a fixed chute belt which is stretched over the first driving pulley 43 and the clamping pulleys 44 and is driven by the first driving pulley 43 driven by a drive motor (not shown).

In FIGS. 4, 5, 8 and 12 to 14, the reference numeral 46 designates a second driving pulley which is attached to the movable chute 32 and is driven by a drive motor (not shown), and the reference numerals 47 designate driven pulleys which are attached to the movable chute 33. The reference numeral 48 designates a movable chute belt which is stretched over the second driving pulley 46 and the driven pulleys 47 and is driven by the second driving pulley 46.

The fixed chute belt 45 and the movable chute belt 48 are driven by the first driving pulley 43 and the second driving pulley 46, to convey the printed circuit board 8. The reference numeral 50 designates a stopper pin which is engaged with the printed circuit board 8 conveyed on the above belts 45 and 48 to stop the printed circuit board 8. The stopper pin 50 is lowered by a driving source (not shown) if the printed circuit board 8 is discharged, to release the printed circuit board 8.

The reference numeral 51 designates a pressure block which is rotated around a supporting shaft 52 provided in the movable chute 33 and provided with a lot of pressure rollers 53. The reference numeral 54 designates a pressure block cylinder which is attached to the movable chute 33 and pushes a push-up roller 55 provided in the lower end of the pressure block 51 up to rotate the pressure block 51 in a counterclockwise direction.

More specifically, after the printed circuit board 8 is conveyed on the above described belts 45 and 48 and is engaged with the stopper pin 50 to be stopped, the fixed chute 25 and the movable chute 33 which have been raised to almost the same height as those of the feed conveyers 2 and the discharge conveyers 4 as shown in FIG. 6 by driving of the chute raising and lowering cylinder 27 are lowered until the mounting pieces 30 abut on the guide bodies 28 as shown in FIG. 7 by the fall of the chute raising and lowering cylinder 27. Consequently, the printed circuit board 8 on the above belts 45 and 48 is pushed-up by the back-up pins 18 to be positioned at a height at which the pressure rollers 53 can abut on the printed circuit board 8.

Figure 11:
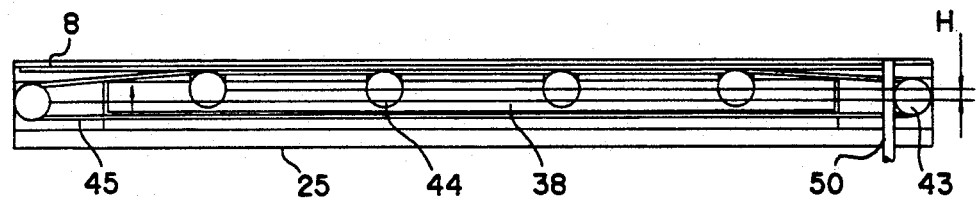
Figure 13:
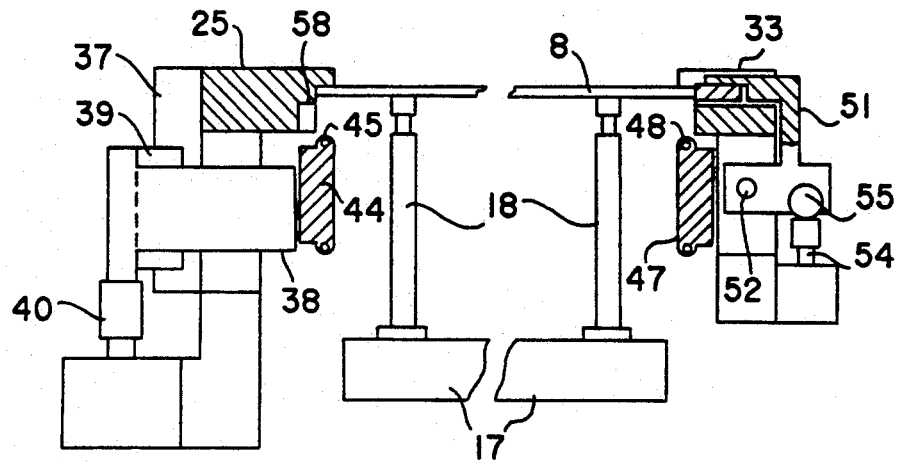

Then the pressure block cylinder 54 is raised so that the pressure rollers 53 press the printed circuit board 8 against a chute surface 56 of the fixed chute 25, resulting in a state shown in FIG. 13. An upper wall 57 as shown in FIG. 12 is formed in the upper end of the chute surface 56 of the fixed chute 21. If the clamping cylinder 40 raises the clamp block 38 in the state shown in FIG. 13, the clamping pulley 44 attached to the clamp block 38 pushes the above described belt 45 up by a height H as shown in FIG. 11. Accordingly, the printed circuit board 8 is sandwiched between the upper wall 57 of the fixed chute 25 and the fixed chute belt 45 and is fixed by the pressure.

The chute surface 56 of the fixed chute 25 is provided with a notch portion 58 so as not to come into contact with the fixed chute 25 when the clamping pulley 44 is raised. The above described belt 45 is an elastic body and thus, absorbs the unevenness of the surface of the printed circuit board 8 or the thickness of the printed circuit board 8 even if the surface of the printed circuit board 8 is irregular or there is a variation in the thickness of the printed circuit board 8. The reference numeral 59 designates an upper wall which is provided in the upper end of the movable chute 32 such that the printed circuit board 8 is not moved upward.

In FIGS. 4 and 5, the reference numeral 60 designates a light projecting and receiving sensor which is attached to both ends of a side surface, on which the movable chute belt 48 is mounted, of the movable chute 33 for detecting the presence or absence of obstacles such as the back-up pins 18 and comprises a projector 61 mounted on the upstream side of the movable chute 33 for projecting a light beam and a receiver 62 mounted on the downstream side thereof for receiving the light beam projected by the projector 61.

When the above described ball screw 34 is rotated with the fixed chute 25, the supporting plate 31 and the movable chute 33 being lowered, the movable chute 33 is moved toward the fixed chute 25 in accordance with the size of the printed circuit board 8, if the back-up pins 18 which are obstacles are set up as shown in FIG. 5, the back-up pins 18 intercept the light beam projected by the projector 61 and thus, the receiver 62 receives no light beam. Accordingly, the light projecting and receiving sensor 60 detects the back-up pins 18.

Then, the chute moving motor 35 stops driving of the above described ball screw 34 to stop the movement of the movable chute 33 and to turn a warning lamp 63 on.

Meanwhile, the light projecting and receiving sensor 60 may be provided an outside of the movable chute 33 to detect obstacles such as the back-up pins 18 when the movable chute 33 is moved toward the supporting plate 31.

Consequently, in a case where the size of the printed circuit board 8 and the chute width are changed, even if the back-up pins 18 remain within the moving range of the movable chute 33, the movable chute 33 and the back-up pin 18 can be prevented from colliding with each other by the light projecting and receiving sensor 60.

The obstacles such as the back-up pins 18 within the moving range of the movable chute 33 can be also detected by using a recognition camera from above.

The Y head portion 5 will be described in detail.

In FIGS. 1 and 2, the reference numerals 65 and 66 designate mounting heads each having three take-out nozzles 67 for absorbing and taking chip parts (not shown) out from the tape feeder 6 replaceably mounted on its lower surface, which are attached to ball screw 69 through nuts 68. The reference numerals 70 designate head driving motors for rotating the ball screw 69. The motors 70 rotate the above ball screw 69 so that the mounting heads 65 and 66 are moved in a Y direction. The reference numerals 71 designate head linear guides for supporting the mounting heads 65 and 66 and guiding the movement thereof in the Y direction.

The reference numerals 64 designate board recognition cameras attached upside down to the mounting heads 65 and 66, which recognize the position of the printed circuit board 8 sandwiched between the fixed chute belt 45 and the upper wall 57 and fixed by pressure on the X table 12 by recognizing a plurality of positioning marks put on the printed circuit board 8. Therefore, the printed circuit board 8 need not be positioned in its regular place, provided that it is fixed to prevent movement.

The reference numerals 72 designate parts recognition cameras which recognize chip parts (not shown) absorbed by the take-out nozzles 67 positioned in the upper parts of the mounting heads 65 and 66 by the movement thereof in the Y direction. After the recognition cameras 72 recognize the chip parts, the mounting heads 65 and 66 are further moved to positions above the X table 12. The take-out nozzles 67 which absorbed the chip parts are positioned above a predetermined place of the printed circuit board 8 mounted and fixed on the X table 12 and supported by the back-up pins 18 by the movement of the above X table 12 in the X direction and the movement of the mounting heads 65 and 66 in the Y direction, to mount the above chip parts on the printed circuit board 8.

The mounting heads 65 and 66 can be positioned on the nozzle housing portion 7 by the movement in the Y direction. In the nozzle housing portion 7, the take-out nozzles 67 can be replaced.

The reference numeral 73 designates a back-up pin replacing unit (referred to as a B/P replacing unit hereinafter) attached to the mounting head 65, which is moved to an arbitrary position above the X table 12 and the B/P stocker 22 to replace the back-up pins 18. The back-up pins 18 are replaced as shown in FIGS. 8 and 24 to 39.

The B/P replacing unit 73 is moved only in the Y direction because the same is attached to the mounting head 65. If the B/P replacing unit 73 itself is also moved in the X direction and the Y direction, however, the B/P stocker 22 may be fixed in not only the X table 12 but also a place other than the X table 12 within the moving range of the B/P replacing unit 73.

If the board base 17 and the B/P stocker 22 are attached to a table which is moved in the X and Y directions, on the other hand, the B/P replacing unit 73 may be fixed in its regular position so as not to be movable in the X and Y directions.

The B/P replacing unit 73 will be described in detail with reference to FIGS. 15 to 21.

The reference numeral 74 designates a slide unit which is guided by a pair of guide bars 75 attached to the mounting head 65 and is reciprocated up and down by compressed air. The reference numeral 76 designates a silky chuck which is attached to the slide unit 74 through an mounting plate 77. The reference numeral 78 designates an upper limit sensor for sensing whether or not the slide unit 74 is raised to its upper limit, and the reference numeral 79 designates a lower limit sensor for sensing whether or not the slide unit 74 is lowered to its lower limit.

The reference numerals 80 and 81 designate chuck claws for holding the back-up pin 18 therebetween, which are attached to fingers 82 in the lower end of the silky chuck 76. The reference numeral 83 designates a silky chuck body portion which is a main body of the silky chuck 76. The reference numerals 84 designate needle pins which are provided in the fingers 82, and the reference numerals 85 designate rotating levers which are rotated around supporting shafts 86 provided in the silky chuck body portion 83. The reference numeral 87 designates a spring which is engaged with the inside of the fingers 82 for urging both the fingers 82 to be opened. The reference numeral 88 designates a piston moved up and down within a cavity portion 89, which is pressed by compressed air supplied from a compressed air suction port 90 to be lowered. The reference numeral 91 designates a packing for covering the compressed air tight not to leak.

When the piston 88 is pushed down, the lower end of the piston 88 is engaged with the rotating levers 85 to rotate the rotating levers 85 inward. The rotating levers 85 which are rotated inward are engaged with the needle pins 84 to close both the fingers 82 against the spring 87. Accordingly, the chuck claws 80 and 81 are closed and thus, can hold the back-up pin 18 therebetween. If the pressure of air supplied from the compressed air suction port 90 drops, the fingers 82 are opened while pushing the piston 88 up through the rotating levers 85 by the urging force of the spring 87. Accordingly, the chuck claws 80 and 81 are opened.

Figure 21:
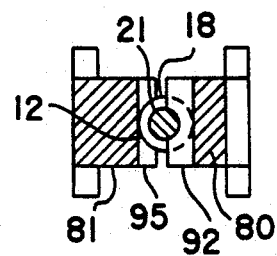
FIG. 21 is a cross sectional view taken along a line A—A' in FIG. 20.

One of the chuck claws 80 is provided with a convex portion 92. A surface, which abuts on the back-up pin 18, of the convex portion 92 takes such a shape that it is fitted to the reduced diameter portion 21, as shown in FIG. 21. The other chuck claw 81 is provided with a triangular groove 93 in the longitudinal direction, as shown in FIG. 21. In holding the back-up pin 18, two surfaces which form the groove 93 abut on a large diameter portion of the back-up pin 18.

When the chuck claws 80 and 81 are closed, the chuck claw 80 is fitted to the reduced diameter portion 21 of the back-up pin 18 and the chuck claw 81 abuts on the large diameter portion thereof on its two surfaces, to hold the back-up pin 18. The holding operation is performed in a position where the slide unit 74 is lowered to its lower limit. The upward motion of the slide unit 74 in this state causes the back-up pin 18 to be lifted. When the back-up pin 18 is lifted, the back-up pin 18 is securely held between the chuck claws 80 and 81 so as not to be moved relative to the chuck claws 80 and 81. However, a large force is required in lifting the back-up pin 18. Accordingly, even if the position of the chuck claws 80 and 81 relative to the back-up pin 18 are shifted, the upper surface of the convex portion 92 of the chuck claw 80 abuts on the lower surface of the large diameter portion on the upper side of the back-up pin 18, thereby to make it possible to lift the back-up pin 18.

The reference numeral 94 designates a chuck mistake sensor which senses that the chuck claws 80 and 81 make chuck mistakes to be closed to a stroke or more at which the back-up pin 18 is held. The chuck claw 81 is provided with a concave portion 95 so as to prevent only the convex portion 92 from coming into contact with the chuck claw 81 when the chuck claws 80 and 81 are closed without holding the back-up pin 18 and to cause the chuck claws 80 and 81 to be closed to a stroke at which chuck mistakes can be judged when the chuck mistake sensor 94 senses the chuck mistakes.

Meanwhile, the lower limit position of the slide unit 74 is always constant. Accordingly, the positions where the chuck claws 80 and 81 are lowered and stopped are constant. Therefore, the heights of the upper surfaces of the B/P stocker 22 and the board base 17 are made equal to each other, as described above. However, the height of the upper surface of the B/P stocker 22 may be different from that of the board base 17, provided that the position where the slide unit 74 is lowered and stopped is made variable.

The reference numeral 96 shown in FIGS. 4 and 8 designates a back-up pin recovery box (referred to as B/P recovery box hereinafter) in which the back-up pin 18 held between the chuck claws 80 and 81 is recovered when the back-up pin 18 cannot be disposed on the board base 17 or the B/P stocker 22.

Figure 22:
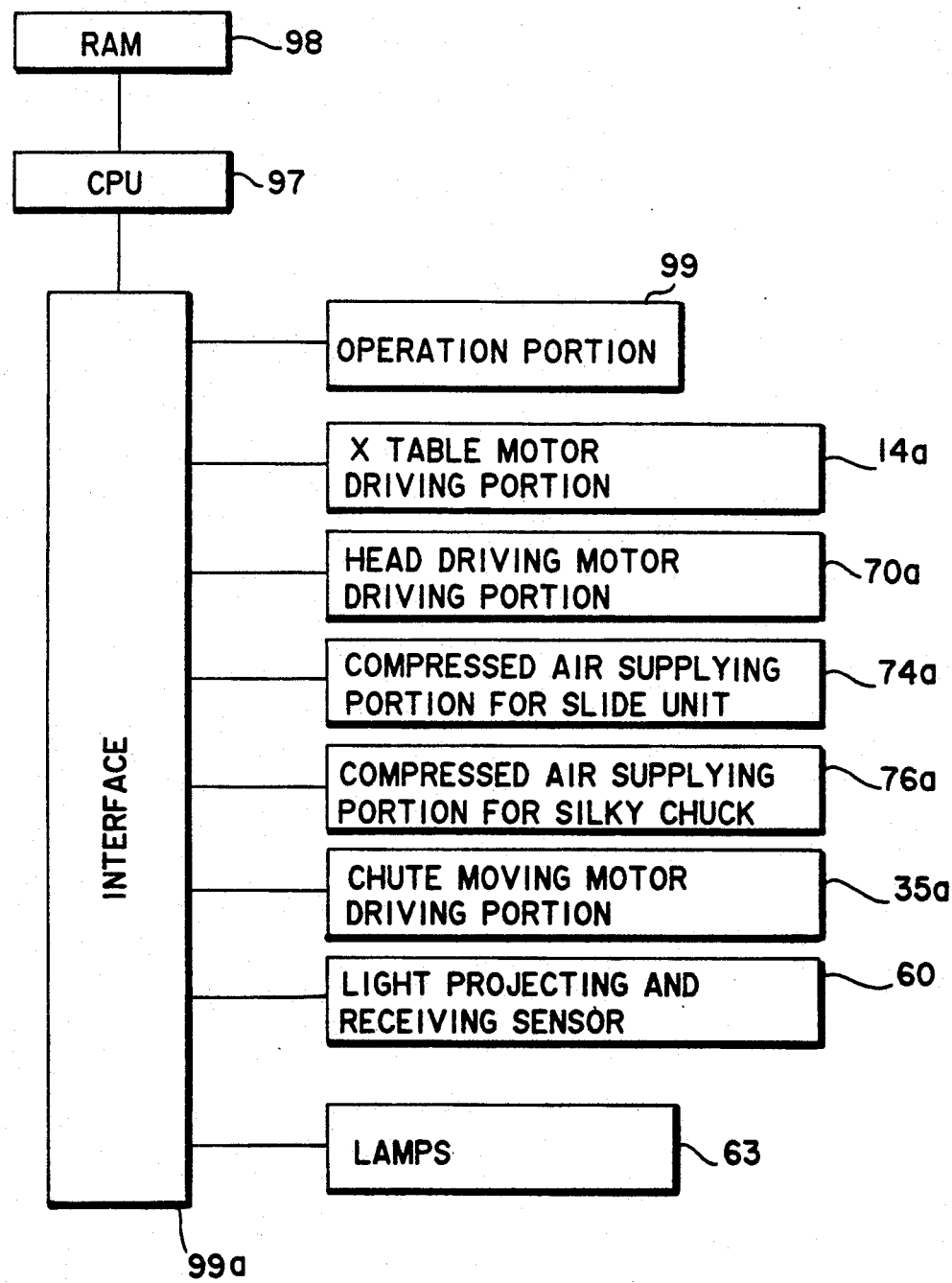
FIG. 22 is a diagram showing a control block for replacing back-up pins of the first embodiment.

In FIG. 22, the reference numeral 97 designates a CPU which executes a control associated with mounting of parts by the parts mounting apparatus 1 on the basis of a variety of information. The reference numeral 98 designates a RAM which stores, for example, NC data representing the size of the printed circuit board 8, the type of length of the back-up pin 18 mounted on the board base 17 and the X and Y coordinates of a mounting position depending on the type of the printed circuit board 8. The reference numeral 99 designates an operation portion for inputting various data such as the above NC data by each key operation.

The reference numeral 14a designates an X table motor driving portion for driving the X table motor 14, and the reference numeral 70a designates a head driving motor driving portion for driving the head driving motor 70. The reference numeral 74a designates a compressed air supplying portion for a slide unit for driving the vertical motion of the slide unit 74, and the reference numeral 76a designates a compressed air supplying portion for a silky chuck for driving the opening and closing of the chuck claws 80 and 81 by the silky chuck 7. The reference numeral 35a designates a chute moving motor driving portion for driving the chute moving motor 35. The reference numeral 99a designates an interface.

An operation of the parts mounting apparatus constructed as described above will be described.

When the parts mounting apparatus 1 attempts to mount parts on a different type of printed circuit board 8 from the printed circuit board 8 on which parts have been mounted, the back-up pins 18 are replaced and the movable chute 33 is moved corresponding to the printed circuit board 8 on which parts will be mounted. The width between the feed conveyor 2 and the width between discharge conveyer 4 are also changed. Such operations are performed by the control of the CPU 97 on the basis of the NC data inputted by the operation portion 99 and stored in the RAM 98. The operations are also performed in a state where the chute raising and lowering cylinder 27 is lowered, that is, the fixed chute 25 and the movable chute 33 are lowered for the purpose of saving time for preparation.

Description is now made of a replacing operation of back-up pins. When the back-up pin 18 on the board base 17 is moved to the B/P stocker 22 and is disposed thereon, the following operations are performed.

Figure 23:
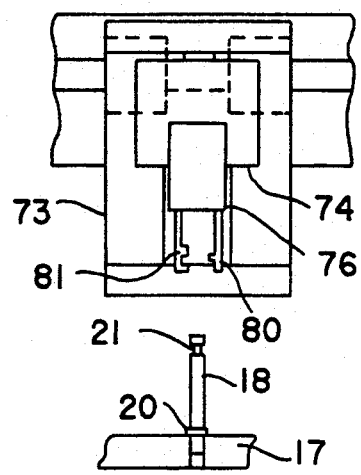
FIGS. 23 to 38 are diagrams showing the processes of replacing the back-up pins in the first embodiment.

More specifically, the X table motor 14 driven by the X table motor driving portion 14a rotates the X ball screw 15 to move the X table 12 provided with the nut 13 in the X direction along the pair of table moving linear guides 11. On the other hand, the mounting head 65 provided with the B/P replacing unit 73 is moved in the Y direction through the nut 68 by the head driving motor 70 driven by the head driving motor driving portion 101 rotating the head ball screws 69. Thus, B/P replacing unit 73 is positioned above the back-up pin 18 on the board base 17, as shown in FIG. 23.

Figure 24:
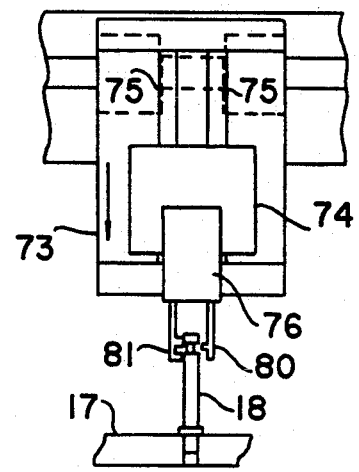
Figure 25:
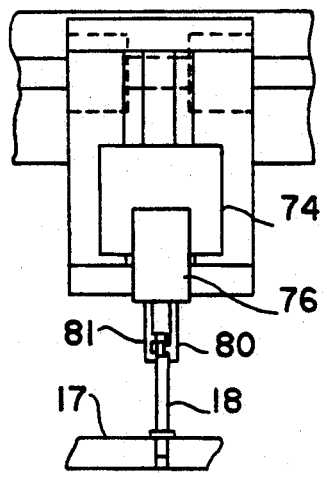

Thereafter, the slide unit 74 is lowered to its lower limit which is sensed by the lower limit sensor 79 along the guide bars 75 due to the compressed air supplied by the compressed air supplying portion 74a, resulting in a state shown in FIG. 24. In the silky chuck 76, if compressed air is supplied from the compressed air suction port 90 by the compressed air supplying portion 76a, the piston 88 is lowered in the cavity portion 89. Accordingly, the rotating levers 85 are rotated inward so that the fingers 82 are closed against the spring 87 through the needle pins 84. Consequently, the chuck claws 80 and 81 attached to the fingers 82 are closed so that the convex portion 92 of the chuck claw 80 abuts on the reduced diameter portion 21 of the back-up pin 18 and groove 93 of the chuck claw 81 abuts on the large diameter portion thereof, to hold the back-up pin 18 as shown in FIG. 25.

Figure 26:
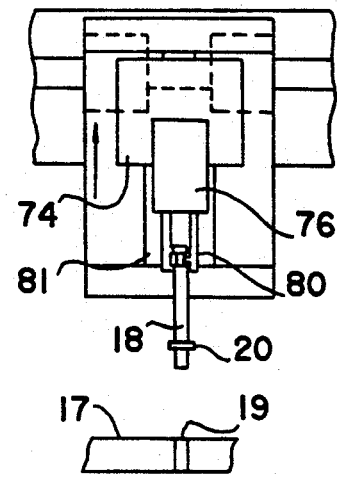
Figure 27:
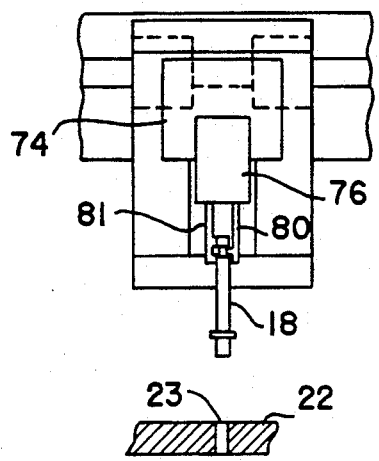

The slide unit 74 is raised to its upper unit which is sensed by the upper limit sensor 78 with the back-up pin 18 being held between the chuck claws 80 and 81. Thus, the back-up pin 18 is pulled out of the board base 17, as shown in FIG. 26. Then the X table motor 14 and the head driving motor 70 are rotated as described above, to move the above B/P replacing unit 73 which holds the back-up pin 18 to a position above the B/P stocker 22 so that the back-up pin 18 is positioned over the housing opening 23 in which it is to be next mounted in a region where the corresponding type of back-up pin is contained, as shown in FIG. 27.

Figure 28:
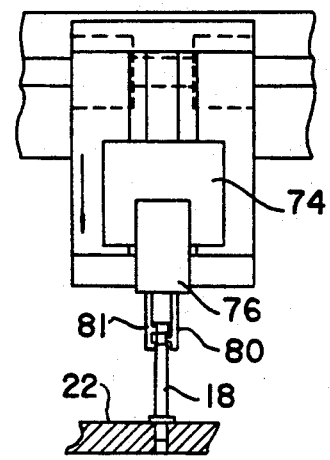
Figure 29:
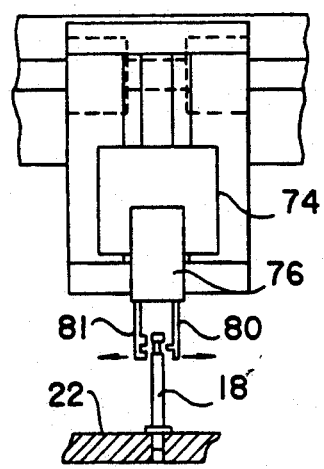
Figure 30:
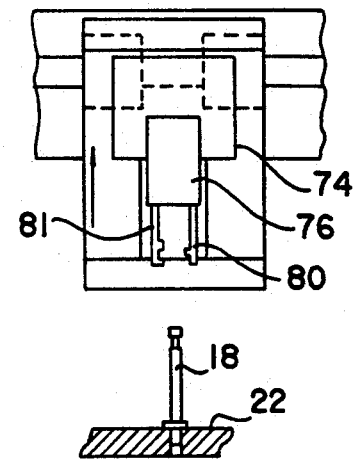

Then the slide unit 74 is lowered so that the above described back-up pin 18 is mounted in the above opening 23 as shown in FIG. 28. The chuck claws 80 and 81 are urged by the spring 87 due to the decrease in pressure of air supplied from the compressed air suction port, to be opened as shown in FIG. 29. Thereafter, the slide unit 74 is raised as shown in FIG. 30. Thus, the movement of the back-up pin 18 from the board base 17 on the X table 12 to the B/P stocker 22 and the disposition of the back-up pin 18 on the B/P stocker 22 is completed.

Description is now made of a case where another type of back-up pin 18 used for supporting a printed circuit board 8 on which parts will be mounted is moved to the board base 17 from the B/P stocker 22 and disposed thereon.

Figure 31:
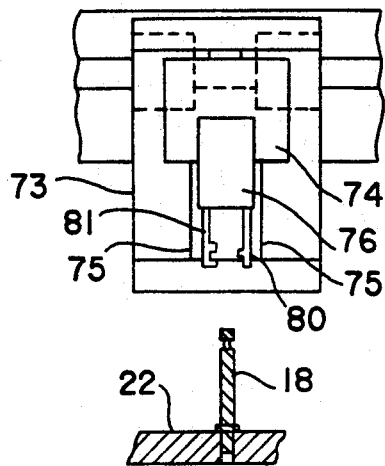
Figure 32:
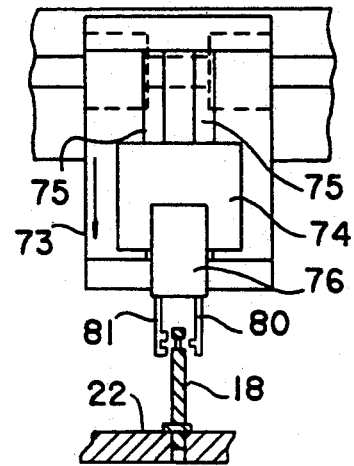
Figure 33:
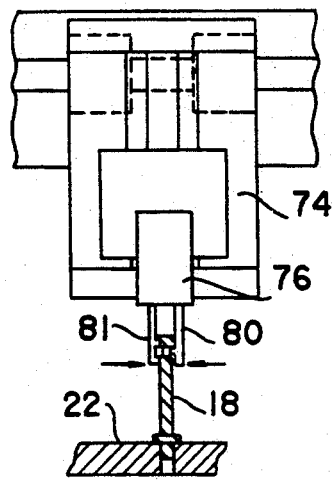

For example, the B/P replacing unit 73 in the state shown in FIG. 30 is moved to a position above the corresponding back-up pin 18 on the B/P stocker 22 by the rotation of the X table motor 14 and the head driving motor 70, to be stopped as shown in FIG. 31. The slide unit 74 is lowered to its lower limit, as shown in FIG. 32. The chuck claws 80 and 81 are closed to hold the back-up pin 18, as shown in FIG. 33.

Figure 34:
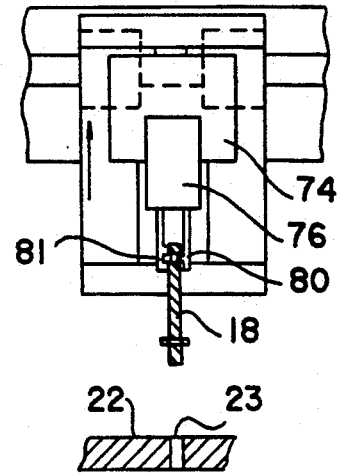
Figure 35:
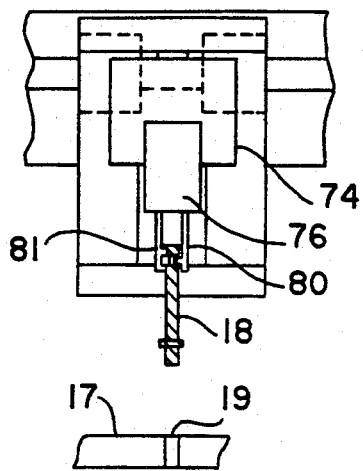
Figure 36:
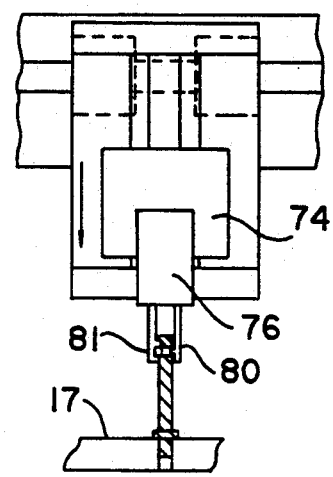
Figure 37:
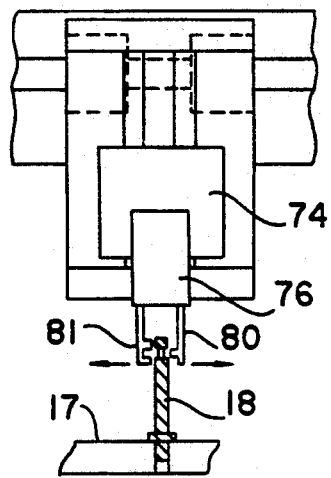
Figure 38:
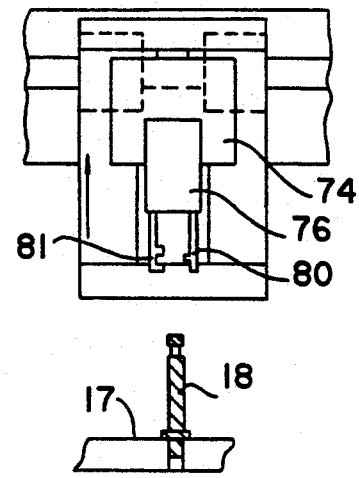

Then the slide unit 74 is raised while holding the back-up pin 18, as shown in FIG. 34. The B/P replacing unit 73 is moved on the basis of the NC data, to be stopped in the corresponding position on the board base 17 as shown in FIG. 35. Thereafter, the slide unit 74 is lowered to mount the back-up pin 18 in the opening 19 as shown in FIG. 36, open the chuck claws 80 and 81 as shown in FIG. 37, and raise the slide unit 74 as shown in FIG. 38. Thus, the back-up pin 18 is moved to the board base 17 from the B/P stocker 22 and disposed thereon.

The B/P replacing unit 73 is then moved to a position above the next back-up pin 18 disposed on the board base 17 so as to replace the back-up pin 18, to perform the foregoing operations.

Such operations are repeated while being controlled by the CPU 97 on the basis of the NC data stored in the RAM 98 to mount the back-up pin 18 for supporting the printed circuit board 8 on which parts will be mounted.

Meanwhile, if the type of the back-up pin 18 which has been mounted on the board base 17 and the type of the back-up pin 18 for supporting the next printed circuit board 8 are the same, the back-up pin 18 pulled out of the board base 17 can be directly mounted in a position, where it is to be mounted, of the board base 17 without being moved to the B/P stocker 22 and disposed thereon.

Furthermore, the B/P replacing unit 73 may, in some cases by moved between the board base 17 and the B/P stocker 22 without holding the back-up pin 18 so that the back-up pin 18 is held only from one of the board base 17 and the B/P stocker 22 to be moved to the other and disposed thereon.

The movable chute 33 is moved in accordance with the size of the printed circuit board 8 on which parts will be mounted, together with the replacement of the back-up pins 18. The movable chute 33 can be moved simultaneously with the replacement of the back-up pins 18 excluding the back-up pins 18 in the moving range of the movable chute 33. The movable chute 33 is moved by the chute moving motor 35 rotating the ball screw 34. A nut (not shown) is fitted to the ball screw 34. The movable chute 33 attached to the nut is moved along the movable chute linear guides 32.

If the back-up pins 18 remain during the movement of the movable chute 33 and intercept the light beam projected by the projector 61 so that the receiver 62 does not receive the light beam, the light projecting and receiving sensor 60 senses the back-up pins 18 to stop the rotation of the chute moving motor 35. Accordingly, the movement of the movable chute 33 is stopped and at the same time, the warning lamp 63 is turned on. The back-up pins 18 remain in cases such as a case where an error occurs in the NC data and a case where the back-up pins 18 are disposed by hand work in places other than the places designated on the basis of the NC data.

Thereafter, a worker, who knew by the warning lamp 63 that there are obstacles, removes the obstacles, that is, pulls the back-up pin 18 out. The movable chute 33 remains stopped after the obstacles are removed. The worker operates the operation portion 99, to resume the operation of the movable chute 33.

When the foregoing preparation is completed, resulting in a state where the back-up pin 18 and the movable chute 33 are adapted to the next printed circuit board 8 on which parts will be mounted as described above, the X table motor 14 is rotated. Accordingly, the X table 12 is moved along the table moving linear guides 11 to be stopped in a place where the up-and-down pin 26 is positioned directly over the chute raising and lowering cylinder 27.

When the chute raising and lowering cylinder 27 is moved upward, the cylinder 27 is engaged with the up-and-down pin 26 to push the same up. The fixed chute 25 is raise along the guide body 28 attached to the X table 12 by the slide pin 29 attached to the fixed chute 25 sliding in the guide body 28.

At this time, the supporting plate 31 is raised in the same mechanism and thus, the movable chute 33 is also raised. Consequently, the fixed chute 25 and the movable chute 33 attain the same height as those of feed conveyer 2 and the discharge conveyer 4.

If the printed circuit board 8 is fed to the parts mounting apparatus 1 in this state, the feed conveyer 2 conveys the printed circuit board 8 to deliver the same to the fixed chute 25 and the movable chute 33 in the X table portion 3. The printed circuit board 8 delivered is conveyed with it being disposed on the fixed chute belt 45 and the movable chute belt 48 driven by the first driving pulley 43 and the second driving pulley 46.

If the printed circuit board 8 conveyed to a predetermined position and is sensed by a sensor (not shown), the speed of the rotation of the first driving pulley 43 and the second driving pulley 46 begin to be reduced.

Figure 10:
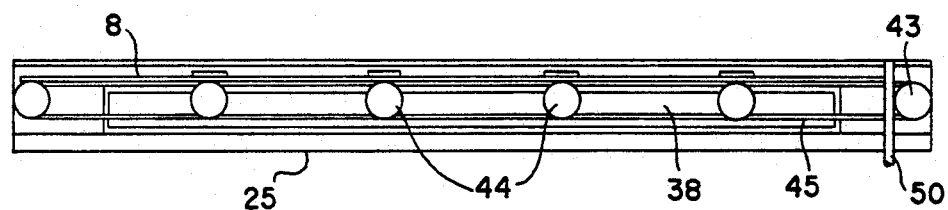

Thereafter, the printed circuit board 8 conveyed on the fixed chute belt 45 and the movable chute belt 48 which are decreasing in speed is engaged with the stopper pin 50, to be stopped as shown in FIG. 10. The first driving pulley 43 and the second driving pulley 46 immediately stop driving of the fixed chute belt 45 and the movable chute belt 48. On this occasion, the positional relation between the printed circuit board 8 and the back-up pin 18 is as shown in FIG. 12. Thereafter, when the chute raising and lowering cylinder 27 is lowered, the fixed chute 25 and the movable chute 33 are lowered. Accordingly, the printed circuit board 8 disposed on both the fixed chute belt 45 and the movable chute belt 48 are also lowered.

Therefore, the printed circuit board 8 is supported by the back-up pins 18, as shown in FIG. 13. At this time, the upper surfaces of ends of the printed circuit board 8 are placed in positions immediately before abutting on the upper wall 57 of the fixed chute 25 and the upper wall 59 of the movable chute 33. The pressure block 51 in a counterclockwise direction in FIG. 13 around the supporting shaft 52 through the push-up roller 55. Accordingly, the pressure rollers 53 press the printed circuit board 8 against the chute surface 56 of the fixed chute 25.

If the clamping cylinder 40 is then moved upward to push the moving body 39 up along the linear guide 37, the clamp block 38 provided with the moving body 39 is moved upward. Accordingly, the fixed chute belt 45 which is stretched over the clamping pulley 44 attached to the clamp block 38 presses the printed circuit board 8 against the upper wall 57 of the fixed chute 25 through the pulley 44, as shown in FIG. 11 and 14. Thus, the printed circuit board 8 is positioned and fixed.

If the printed circuit board 8 is positioned and fixed on the X table 12, the head driving motors 70 rotate the head ball screws 69, to move the mounting heads 65 and 66 to positions above the printed circuit board 8 along the head linear guides 71 through the nuts 68. The plurality of positioning marks put on the printed circuit board 8 by the movement in the X direction of the X table 12 due to the rotation of the X table motor 14 and the movement in the Y direction of the mounting heads 65 and 66 are recognized by the board recognition cameras 64, to recognize the position of the printed circuit board 8.

Thereafter, the mounting heads 65 and 66 are moved to a predetermined tape feeder 6 by the head driving motors 70 rotating the head ball screw 69.

If the three take-out nozzles 67 respectively attached to the mounting heads 65 and 66 take out chip parts (not shown) from the tape feeder 6, the mounting heads 65 and 66 are moved in the direction of the X table portion 3 by the rotation of the ball screws 69. When the three take-out nozzles 67 respectively attached to the mounting heads 65 and 66 pass on the recognition cameras 72, the above respective parts absorbed by the take-out nozzles 67 are recognized by the recognition cameras 72.

Thereafter, the mounting heads 65 and 66 are moved to positions above the X table portion 3. In this X table portion 3, corrections based on the results of the recognition by both the recognition cameras 64 and 72 are made such that the take-out nozzles 67 are placed in predetermined positions of the printed circuit board 8 positioned and fixed in the X table 12. Accordingly, the mounting heads 65 and 66 are moved and stopped in the Y direction, while the X table 12 is moved and stopped in the X direction by the X table motor 14 and the X ball screw 15.

Thereafter, the take-out nozzles 67 make angle $\theta$ corrections of the chip parts absorbed using a nozzle rotating apparatus (not shown) on the basis of the results of the recognition by both the recognition cameras 64 and 72, to mount the chip parts on the printed circuit board 8. The respective three take-out nozzles 67 are moved to predetermined positions of the printed circuit board 8 as described above and make angle $\theta$ corrections of the chip parts absorbed, to mount the chip parts of the printed circuit board 8.

Such a parts mounting operation is repeated.

On completion of mounting of parts, the clamping cylinder 40 is moved downward. Accordingly, the moving body 39 and the clamp block 38 are lowered along the linear guide 37 so that the fixed chute belt 45 releases the pressure of the printed circuit board 8. In addition, the pressure block cylinder 54 is moved downward so that the pressure roller 55 releases the pressure of the printed circuit board 8 to the fixed chute 25. Then the chute raising and lowering cylinder 27 is moved upward, to be engaged with the up-and-down pin 26 which is positioned on the cylinder 27 by the movement of the X table 12 and pushes the same up so that the fixed chute 25 and the movable chute 33 are upward along the guide body 28 to be positioned at the same height as that of the discharge conveyer 4.

Thereafter, if the stopper pin 50 is lowered by a driving source (not shown) to release the printed circuit board 8, the fixed chute belt 45 and the movable chute belt 48 convey the printed circuit board 8 by the rotation of the first driving pulley 43 and the second driving pulley 46 driven by a drive motor (not shown), to deliver the printed circuit board 8 to the discharge conveyer 4. The discharge conveyer 4 conveys the printed circuit board 8 delivered for discharge.

Meanwhile, in a case where the back-up pin 18 held between the chuck claws 80 and 81 cannot be inserted into the opening 19 or the housing opening 23 even if the CPU 97 moves the B/P replacing unit 73 to a predetermined position above the board base 17 or the B/P stocker 22 as described above on the basis of the NC data stored in the RAM 98 to lower the slide unit 74, the lower limit sensor 79 is not operated. In this case, the CPU 97 raises the slide unit 74 and moves the B/P replacing unit 73 to a position above the B/P recovery box 96 to recover the back-up pins 18 in the B/P recovery box 96 by releasing the holding of the back-up pin 18 between the chuck claws 80 and 81.

An impossibility to insert the back-up pin 18 is caused by cases such as a case where the back-up pin is not properly moved to a position over the opening 19 or the housing opening 23 due to an error in the NC data and a case where the back-up pin 18 is bent. However, the non-operating state of the above described sensor 79 may be grasped after a predetermined time period using, for example, a timer.

Furthermore, the replacement of the back-up pin 18 can be made not automatically but by hand work with the X table 12, the B/P replacing unit 73 and the like being stopped.

Additionally, even in the case of a parts mounting apparatus in which the B/P replacing unit 73 is not provided, the B/P stocker 22 may be mounted on the X table 12, which is convenient for replacing the back-up pins 18 by hand work. In this case, the height of the B/P stocker 22 need not be the same as that of the board base 17. In addition, the B/P stocker 22 may be fixed to not the X table 12 but a suitable position on, for example, the base stand 10 in the vicinity of the X table 12. If the B/P stocker 22 is mounted on the X table 12, the B/P stocker 22 can be positioned adjacent to the board base 17 wherever the X table 12 is stopped, which is convenient for replacing the back-up pins 18 by hand work.

Furthermore, the present embodiment is not limited to the parts mounting apparatus 1. For example, it can be also applied to an adhesive applying apparatus for applying adhesives to the printed circuit board 8 and a screen printer for applying solder pastes to the printed circuit board 8 which serve as a printed circuit board assembling apparatus.

Figure 39:
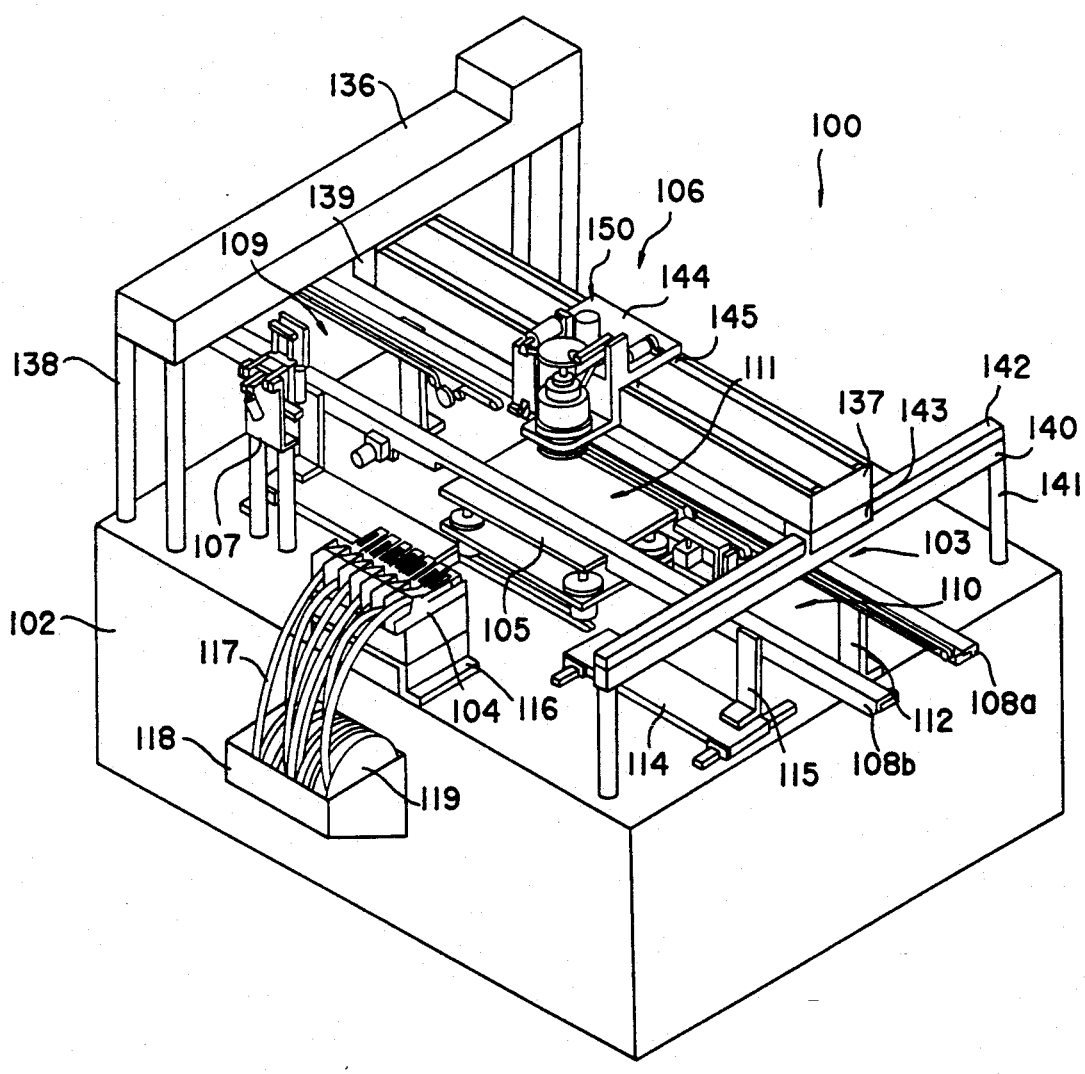
FIG. 39 is a perspective view showing a second embodiment of a parts mounting apparatus.

FIG. 39 shows the entire construction of a parts mounting apparatus 100 of a second embodiment in accordance with the present invention. The parts mounting apparatus 100 is constructed by arranging main components such as a printed circuit board feed conveyer 103, a parts feeding unit 104, a printed circuit board back-up unit 105, a parts mounting unit 106, and a stocker 107 on a main frame 102.

The printed circuit board feed conveyer 103 is mainly composed of a pair of guide rails 108a and 108b, which comprises a feeding portion 109 which is similar to the feed conveyers 2 of the first embodiment, a discharging portion 110 which is similar to the discharge conveyers 4 of the first embodiment, and a positioning portion 111 which is similar to the X table 3 of the first embodiment respectively indicated on the left side, in the right side, and in the central part of FIG. 39. The guide rail 108a is supported on the main frame 102 by angle bars 112. The guide rail 108b is attached by means of the angle bars 115 to bases 114 which are slidable in a direction at right angles to the longitudinal direction of the main frame 102. The width between the guide rails 108a and 108b can be varied depending on the size of a printed circuit board. The feeding portion 109 feeds the printed circuit board (not shown) into the positioning portion 111 when the same receives the printed circuit board from an apparatus in the previous process (not shown). In the positioning portion 111, the printed circuit board is clamped. The clamping is released upon completion of mounting of parts by the parts mounting unit 106. The printed circuit board onto which the parts have been mounted is fed to the discharging portion 110. The discharging portion 110 feeds the printed circuit board into an apparatus in the subsequent process (not shown) when the same receives the printed circuit board.

The parts feeding unit 104 is detachably attached to a frame 116 mounted on the main frame 102. A plurality of parts feeding units are provided. The parts feeding unit 104 feeds a feed tape having a plurality of electronic parts contained at uniform intervals into its parts taking-out position at a feed pitch equal to the spacing of the parts containing recesses. The reference numeral 118 designates a receiving box formed on a side surface of the main frame 102, which contains reels of parts feed tape 117.

Figure 40:
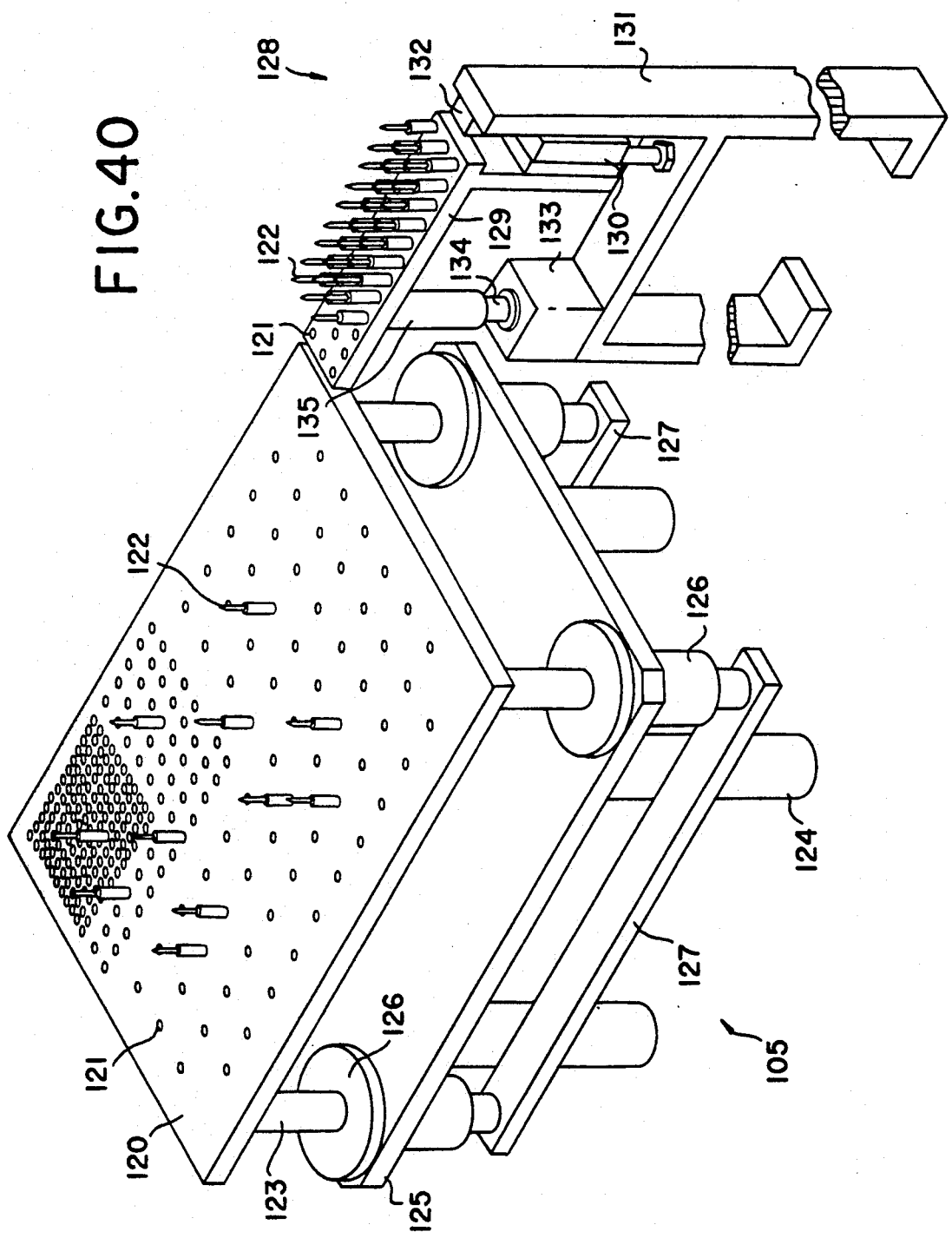
FIG. 40 is a perspective view showing a mounting table portion of the second embodiment.

The printed circuit board back-up unit 105 is set below the positioning portion 111 and the feed conveyer 103. FIG. 40 shows a structure of the board back-up unit 105. The board back-up unit 105 has a back-up pin base 120 which is similar to the board base 17 of the first embodiment and is provided with a plurality of openings or throughholes 121 which are similar to the openings 19 of the first embodiment. The reference numeral 122 designates a back-up pin which is similar to the back-up pin 18 and is detachably inserted into the throughhole 121. Four guide posts 123 are fixed in four corners on the lower surface of the back-up pin base 120. The reference numeral 125 designates a deck which is supported below the back-up pin base 120 by supports 124 standing on the main frame 102. Bearings 126 are mounted in four corners of the deck 125, to which the guide posts 123 are fitted. An air cylinder (not shown) is attached to the central part of the bottom surface of the deck 125. A rod of this air cylinder is connected to the bottom surface of the back-up pin base 120. When the printed circuit board is fed into the positioning portion 111 at the feed conveyer 103, the air cylinder pushes the rod out to lift the back-up pin base 120 so that the back-up pins 122 are brought into contact with the printed circuit board (not shown).

In addition, according to the present invention, the replacing of the back-up pin 122 is automated. In such a case, the air cylinder also raises the back-up pin base 120. The reference numeral 127 designates a stopper block which is mounted in such a shape that it is laid across the lower ends of the guide posts 123 parallel to the printed circuit board feeding direction and abuts on the bearings 126 to regulate the ascending stroke of the back-up pin base 120.

The reference numeral 128 designates a stocker for the back-up pins 122, which is similar to the B/P stocker 22 of the first embodiment. In the stocker 128, a plurality of spare back-up pins 122 are inserted and held in an up-and-down base 129 provided with a plurality of throughholes 121, as in the back-up pin base 120. A slider 130 is attached to a vertical portion of the up-and-down base 129. The slider 130 is movable on a rail 132 attached to a frame 131 for guiding the up-and-down base 129. The reference numeral 133 designates an air cylinder mounted on the upper surface of the frame 131. The slide rod 134 of the air cylinder 133 is connected to the bottom surface of the up-and-down base 129 through a joint 135. The air cylinder 133 pushes the slide rod 134 out to lift the up-and-down base 129 only when the replacing work of the back-up pins 122 is to be performed.

The parts mounting unit 106 has, as moving means, a Y-axis guide body 136 and an X-axis guide body 137 which correspond to the X-axis and the Y-axis of a cartesian-coordinate robot. The Y-axis guide body 136 is supported on the main frame 102 by posts 138. The X-axis guide body 137 has its one end connected to a moving block 139 in the Y-axis guide body 136. The reference numeral 140 designates a rail stand supported on the main frame 102 by posts 141, on which a rail 142 is laid. The other end of the X-axis guide body 137 is connected to the rail 142 through a slider 143. The reference numeral 144 designates a deck attached to a moving block 145 in the X-axis guide body 137 to serve as a base of a working portion 150 (see FIGS. 41 to 43). A bracket 151 is formed on the front of the deck 144. A bearing case 153 in a mounting head, that is, working head 152 is fitted to this bracket 151.

Description is now made of the working head 152 with reference to FIGS. 41 to 48.

In the working head 152, bearings 154 are mounted in the bearing case 153. A hollow shaft 156 containing two spline bearings 155 respectively on the upper and lower sides is fitted to the bearings 154 from below.

A nut 158 is screwed on the uppermost portion of the hollow shaft 156 with a pulley 157 being sandwiched therebetween for preventing the hollow shaft 156 from slipping off. The reference numeral 188 designates a pulse motor attached to the deck 144 through a bracket 189. A pulley 213 is mounted on a shaft 209 of the pulse motor 188. The pulleys 157 and 213 are connected to each other through a timing belt 214. The hollow shaft 156 is rotated by driving the pulse motor 188. A spline shaft 160 having a throughhole 159 at its center is fitted to the spline bearings 155. A flange 161 is fixed on the upper part of the spline shaft 160. The reference numeral 162 designates a nipple screwed into the throughhole 159, to which a hose leading to a vacuum valve (not shown) is connected. The lower part of the spline shaft 160 is screwed into a large diameter portion of a joint pipe 164 having a throughhole with a stepped portion. A cushion pipe 165 provided with a collet 167 on its lower part is fitted to a small diameter portion of the throughhole of the joint pipe 164. A flange is formed on the upper part of the cushion pipe 165 and is in contact with the stepped portion of the throughhole of the joint pipe 164 for preventing itself from falling.

The reference numeral 166 designates a coil spring inserted between the lower end of the spline shaft 160 and the upper end of the cushion pipe 165 to urge the collet 167 downward. The reference numeral 170 designates a bell crank whose rotational center is supported by a pin 172 on a supporting plate 171 extending upward from the deck 144. A roller 173 is attached to one end of the bell crank 170 and is in contact with the lower surface of the flange 161. The other end of the bell crank 170 is connected to a forked portion of a knuckle joint 179 through a knuckle pin 174. The reference numeral 175 designates an air cylinder supported through a knuckle pin 177 on a joint 176 attached to the deck 144. A rod 178 of the air cylinder 175 is screwed into the knuckle joint 179.

The reference numeral 180 designates a lever located above and parallel to the bell crank 170. A roller 181 is attached to one end of the lever 180 to be in contact with the upper surface of the flange 161. The lever 180 is supported on the supporting plate 171 through a pin 182 positioned above the rotational center of the bell crank 170. This pin 182 constitutes the rotational center of the lever 80. A hook pin 183 is mounted on the lever 180 between the rotational center and the roller 181. One end of a coil spring 184 is connected to the hook pin 183. The other end of the coil spring 184 is connected to a hook 185 mounted on the bracket 51. The coil spring 184 always urges the lever 180 in a clockwise direction in FIG. 43. Therefore, the flange 161 is sandwiched between the rollers 173 and 181.

The reference numeral 186 designates a stopper block attached to the supporting plate 171. A bolt 187 is screwed into the stopper block 186. If the air cylinder 175 pulls the rod 178 to rotate the bell crank 170 in a clockwise direction in FIG. 43 until it abuts on the bolt 187, the lever 180 is correspondingly lowered by the urging force of the coil spring 184, thereby letting the flange 161 down to lower the collet 167.

The reference numeral 190 designates a claw supporting table mounted in the lower part of the hollow shaft 156. Four pairs of guide rails 191 are radially arranged on the bottom surface of the claw supporting table 190. A slider 193 to which a downward extending arm 192 is fixed is sandwiched between each pair of the guide rails 191. A parts positioning claw 194 is mounted on the lower end of the arm 192.

The reference numeral 195 designates a pin projecting from the arm 192, the pin being connected by a coil spring 196 with its counterpart on the arm 192 at the opposite side. Accordingly, the parts positioning claw 194 is always urged in the closing direction (the state shown in FIG. 44).

The reference numerals 197 and 198 designate levers mounted on the upper surfaces of the opposite sliders 193. The levers 197 and 198 are arranged symmetrically, with rods 201 and 202 respectively being connected through pins 200. The reference numeral 203 designates a bell crank supported on an edge of the claw supporting table 190 by a supporting shaft 204. The connecting rods 201 and 202 are connected to both ends of the bell crank 203 through pins 205. Accordingly, if one of the slider 193 moves outwardly, the opposite slider 193 also moves outwardly. Other opposite sliders 193 arranged at right angles thereto are connected in the same manner.

The reference numeral 206 designates a claw opening lever connected through a pin 208 to a block 207 projecting from the claw supporting table 190. The lower part of the claw opening lever 206 is in contact with an inner surface of the arm 192 on the side of the lever 197.

The reference numeral 210 designates a pusher for operating the claw opening lever 206. The pusher 210 has an arm formed on the outer periphery of a ring slidably and rotatably fitted to the outside of the bearing case 156. A slide rod 212 of the air cylinder 211 is screwed into one end of this arm. The air cylinder 211 is mounted on the bracket 151 through an angle member 213. The parts positioning claw 194 is opened and closed in the following manner.

Figure 46:
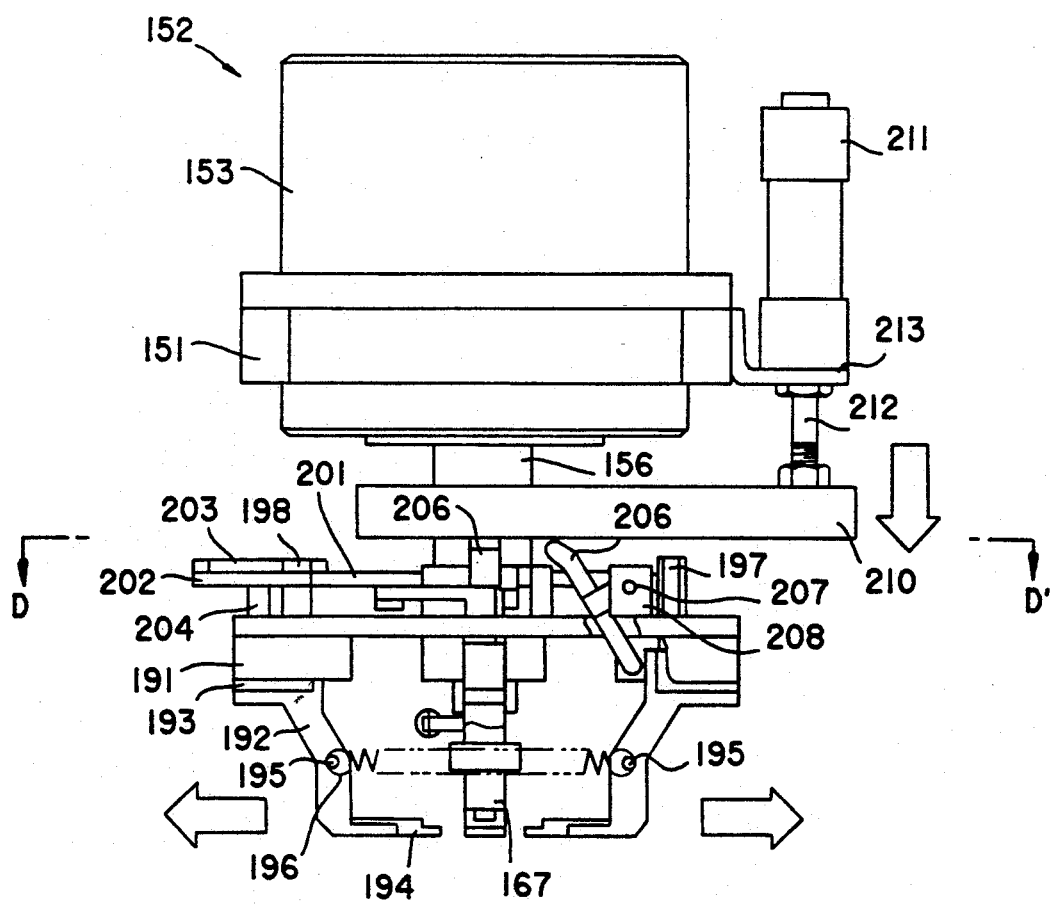
FIG. 46 is a front view showing a state where a part positioning claw is opened in the second embodiment.
Figure 47:
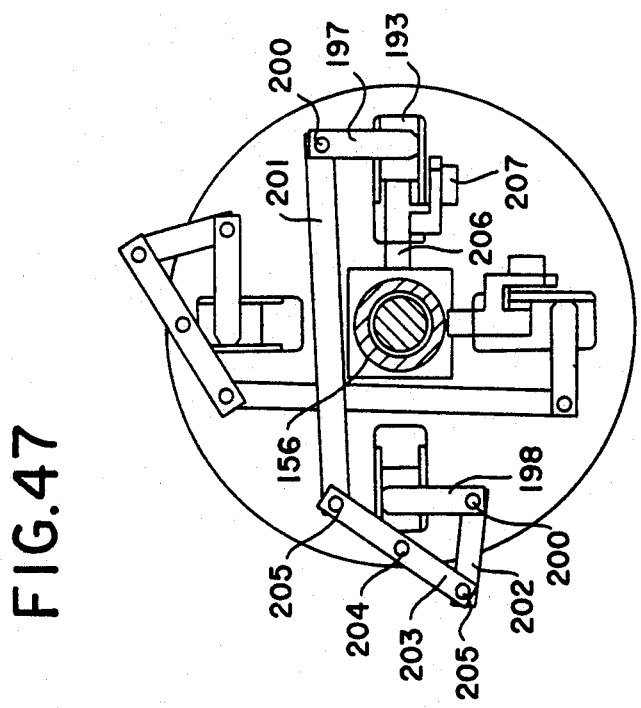
FIG. 47 is a cross sectional view taken along a line D—D' shown in FIG. 46.
Figure 48:
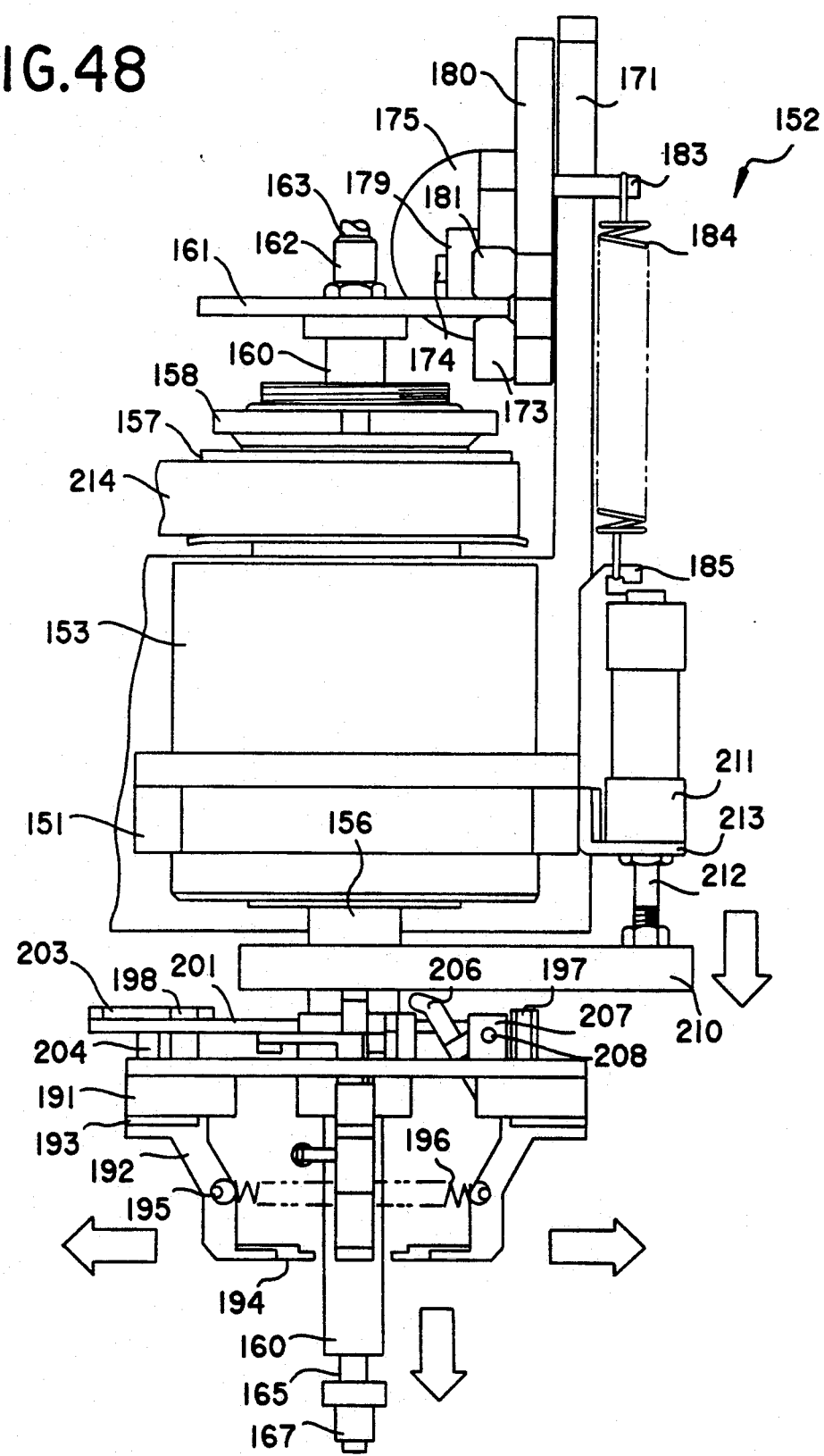
FIG. 48 is a front view showing a state where the working head lowers a collect in the second embodiment.

As shown in FIGS. 46 and 47, the air cylinder 211 pushes the slide rod 212 out to push the pusher 210 down. The lower surface of the pusher 210 abuts on the upper part of the claw opening lever 206. Accordingly, the claw opening lever 206 is rotated so that its upper part is moved in the direction of the center of the claw supporting table 190 and its lower part pushes the arm 192 on the lever 197 side outward. Then the lever 197 pulls the connecting rod 201, to reverse the pulling direction through the bell crank 203. Therefore, the connecting rod 202 pulls the lever 198 outward so that the opposite parts positioning claws 194 are separated from each other. Thereafter, the collet 167 is lowered in the above described manner (see FIG. 48).

Figure 49:
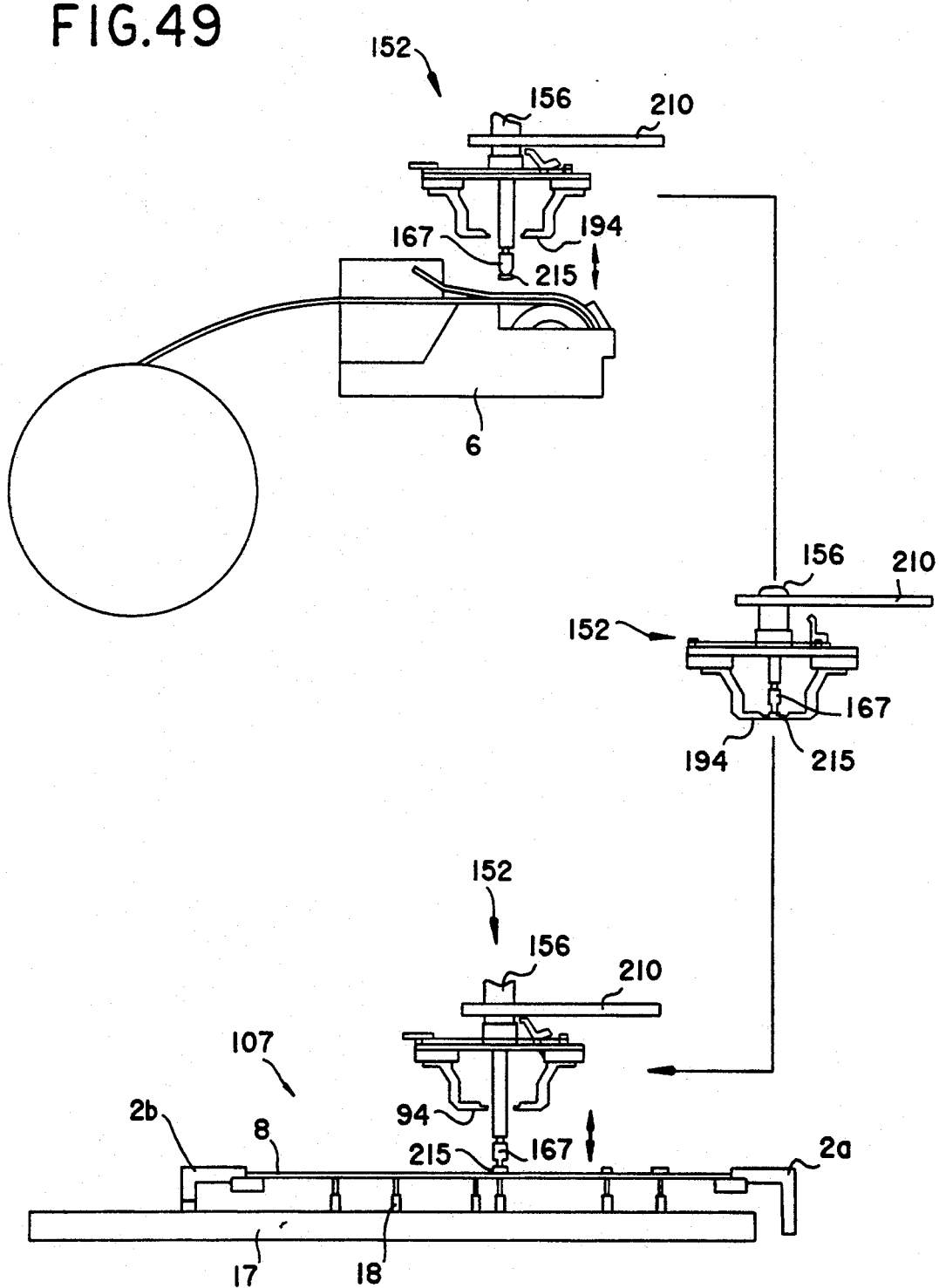
FIG. 49 is a illustrative front view showing a parts mounting operation of the working head of the second embodiment.

Description is now made of a parts mounting operation with reference to FIG. 49.

The mounting head 152 is positioned on a desired parts feeding unit 6 by the movement of the moving blocks 139 and 145. Herein the mounting head 152 opens the parts positioning claw 194 and lowers the collet 167 to absorb an electronic part 215. The mounting head 152 closes the parts positioning claw 194 after raising the collet 167, to center the electronic part 215. The pulse motor 188 is driven to rotate the hollow shaft 156, if necessary, to adjust the direction of the electronic part 215. The Y-axis guide body 136 and the X-axis guide body 137 position the mounting head 152 in a desired parts mounting place of a printed circuit board 119 which is the same as the printed circuit board 8 of the first embodiment and positioned in the positioning portion 107. The mounting head 152 opens the parts positioning claw 194 and lowers the collet 167, to press the electronic part 215 against adhesives applied to the printed circuit board 119. The foregoing operations are repeated.

Figure 41:
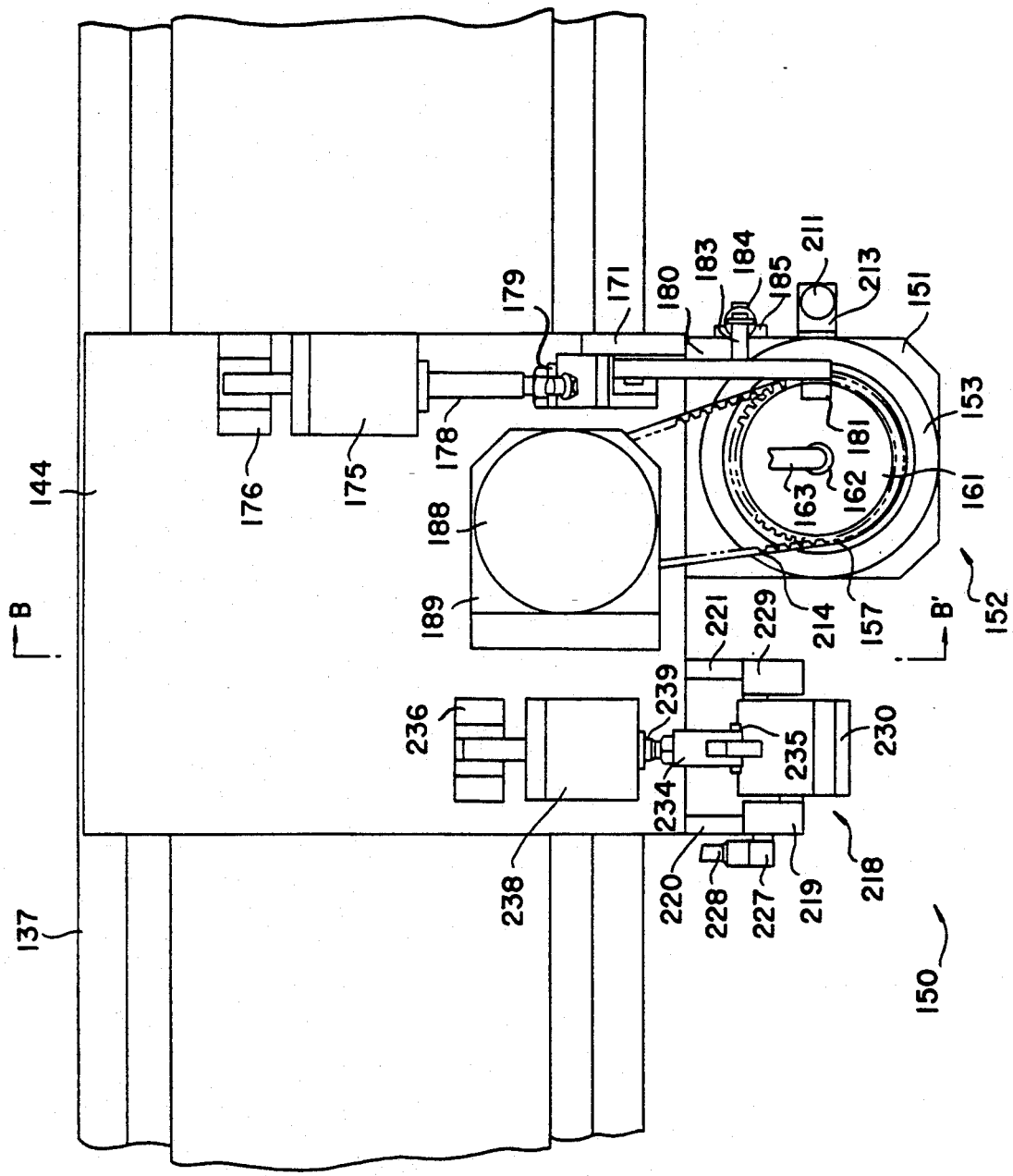
FIG. 41 is a top view showing a structure of a working head portion of the second embodiment.
Figure 42:
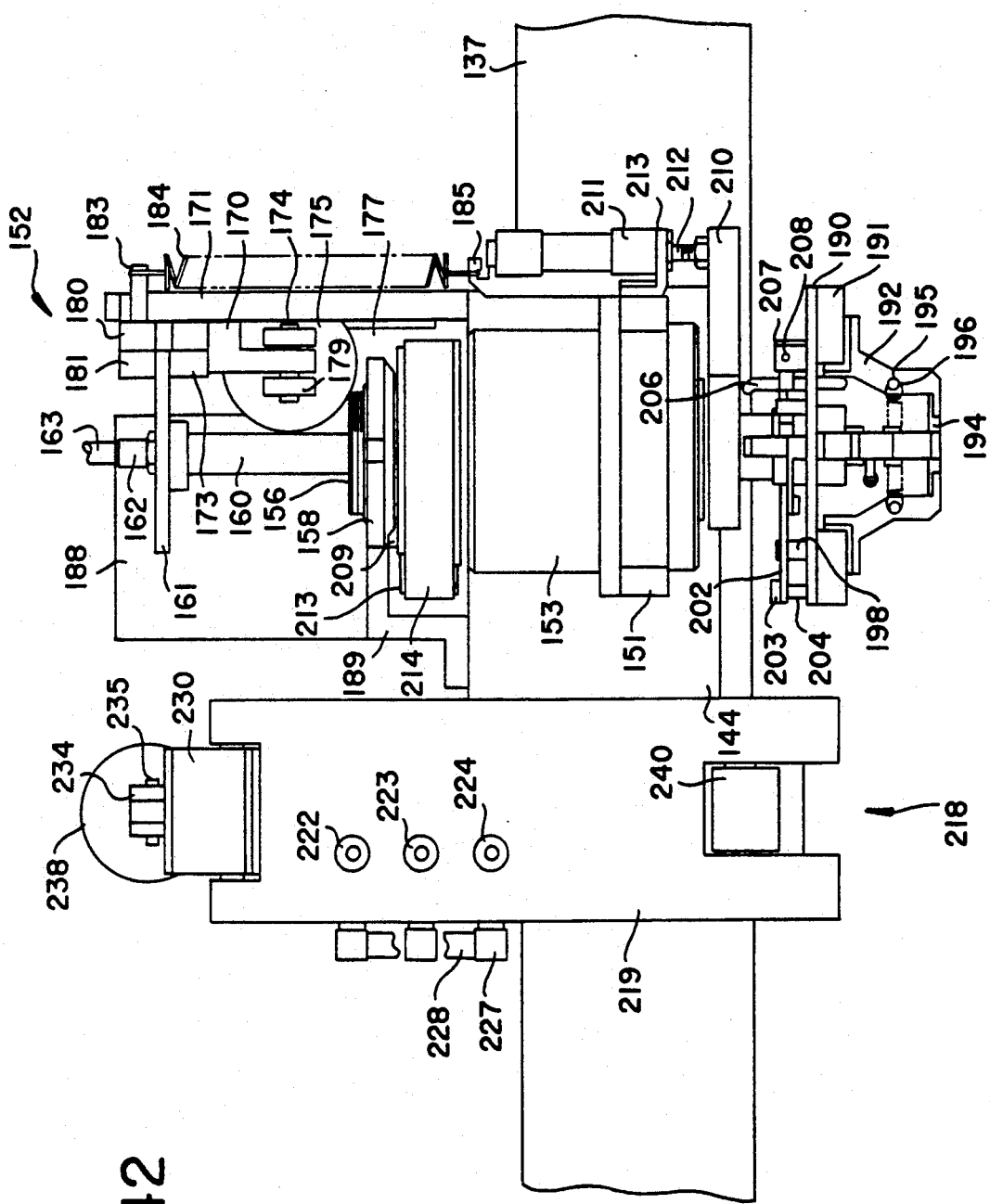
FIG. 42 is a front view showing the structure of the working head portion.
Figure 43:
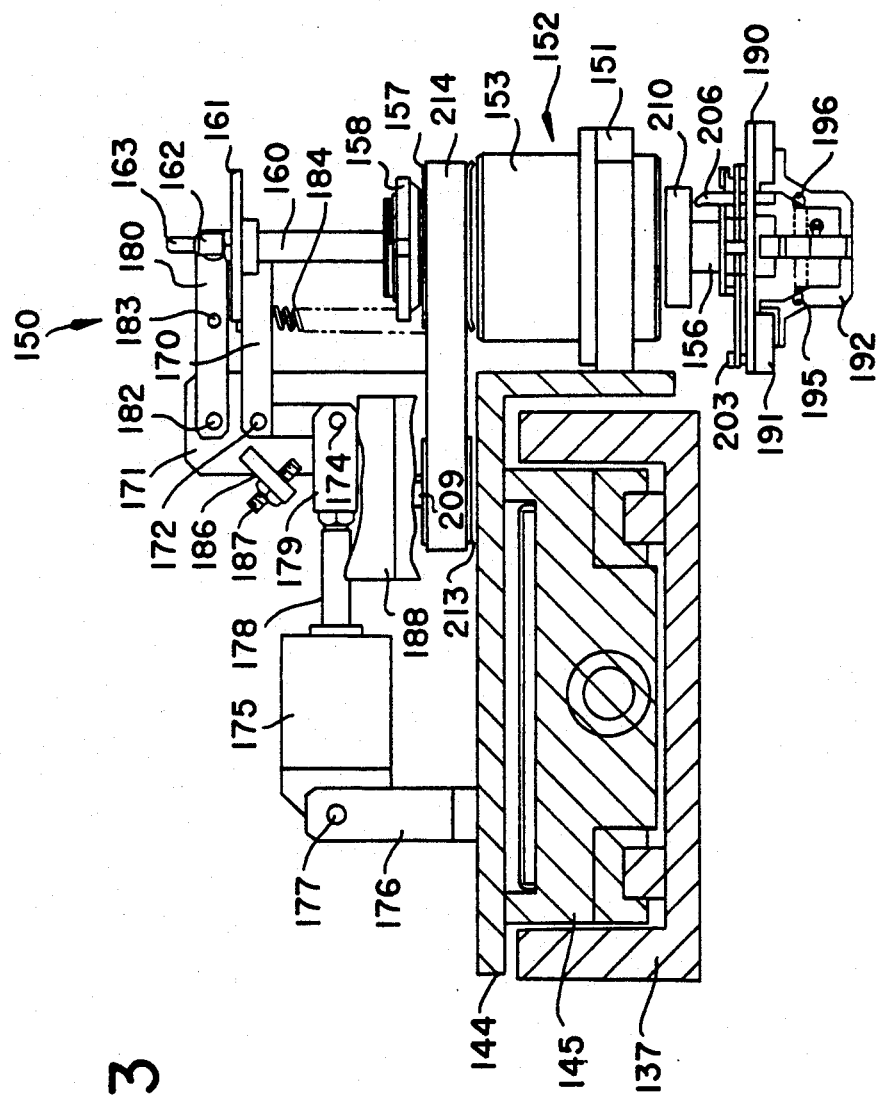
FIG. 43 is a cross sectional view taken along a line B—B' shown in FIG. 41.
Figure 44:
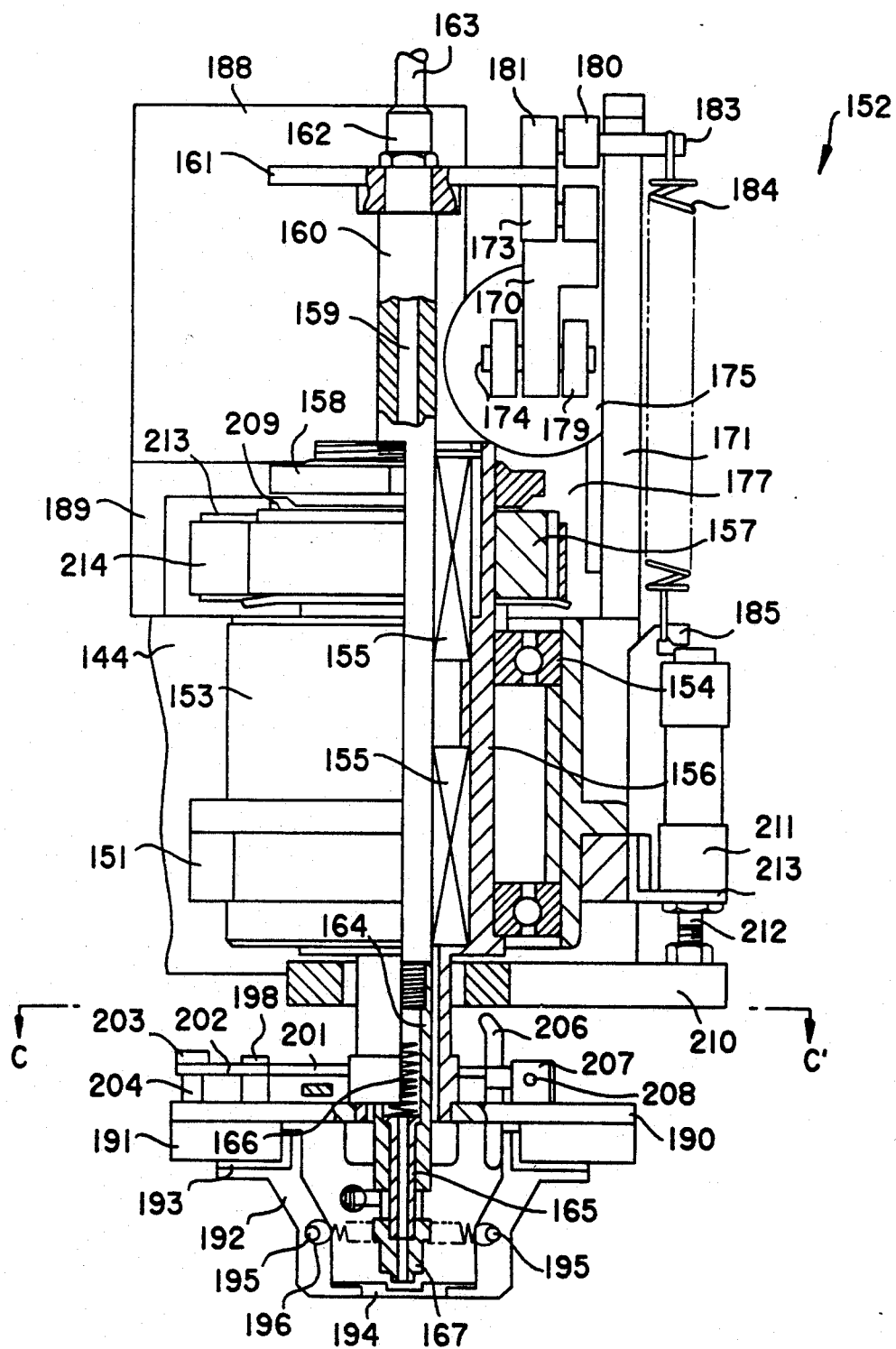
FIG. 44 is a portion cross sectional and broken view showing a structure of a working head of the second embodiment.
Figure 45:
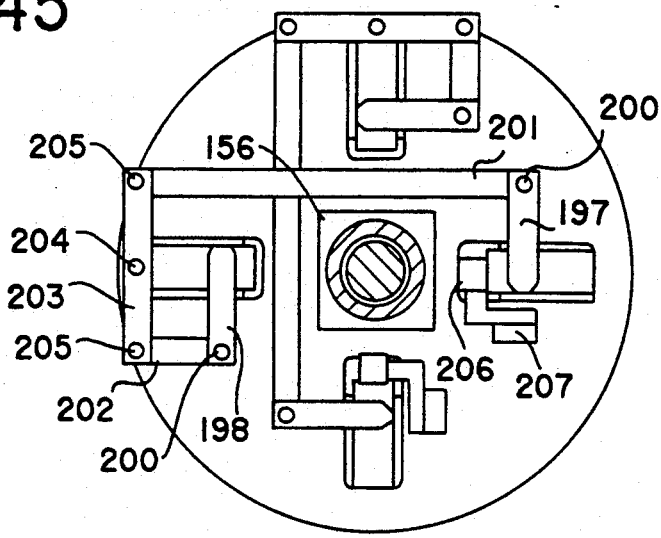
FIG. 45 is a cross sectional view taken along a line C—C' shown in FIG. 44.
Figure 51:
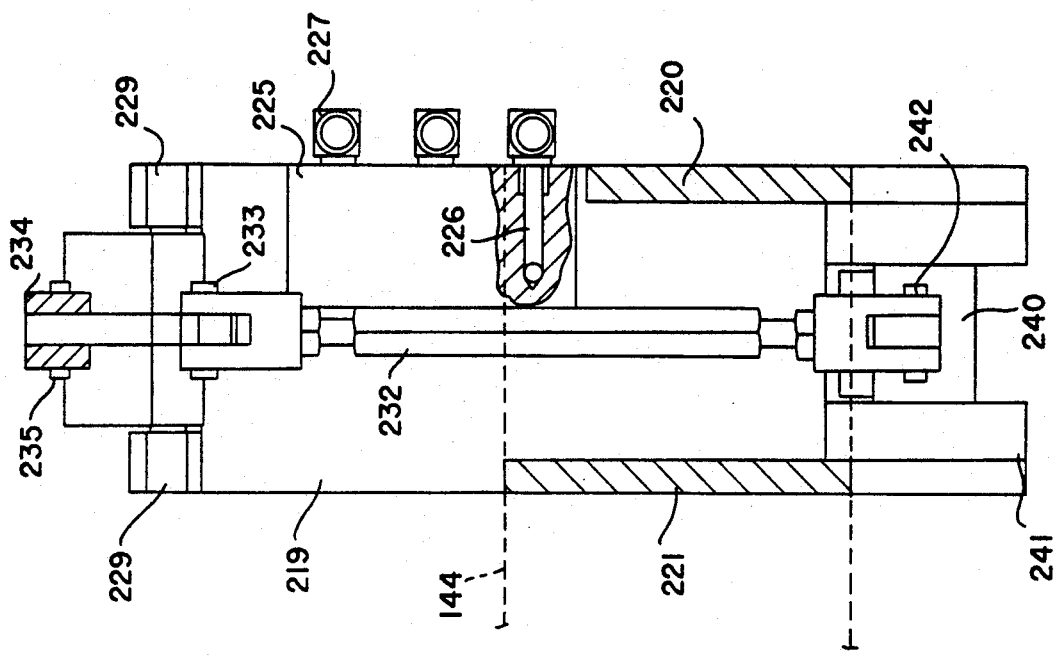
FIG. 51 is a rear elevation showing the structure of the back-up pin replacing head holding portion.

As shown in FIGS. 41 and 42, a back-up pin mounting head holding portion 218 as described below is formed adjacent to the mounting head 152. The holding portion 218 is mainly composed of a base 219. The base 219 is vertically supported by supporting plates 220 and 221 mounted on the front of the deck 144. Funnel-shaped ports 222, 223 and 224 (see FIG. 50) are formed on the front of the base 219. The ports 222, 223 and 224 are respectively connected to ports 226 of a manifold 225 attached to the base 219 (see FIG. 51).

Figure 50:
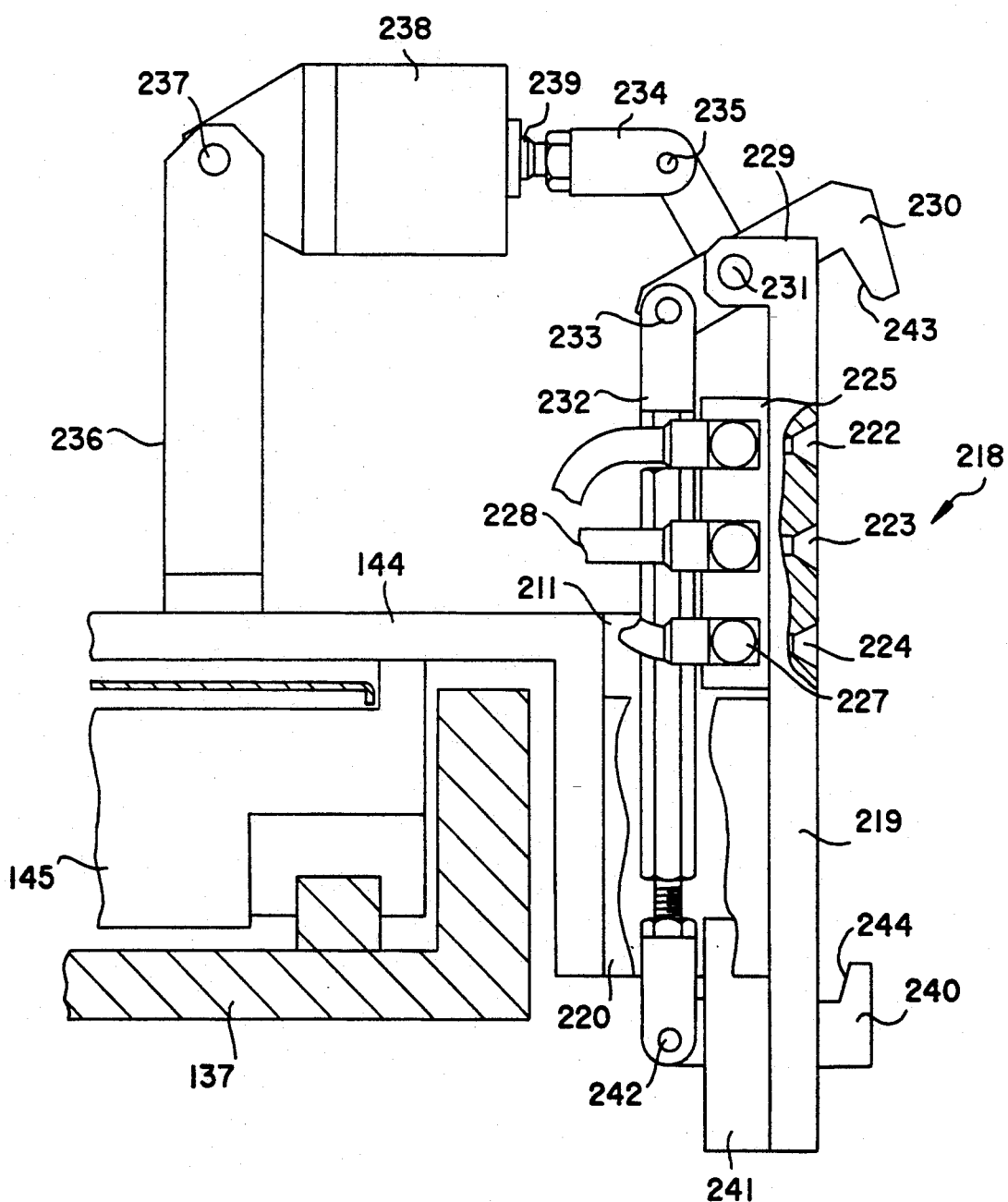
FIG. 50 is a side elevational view showing a structure of a back-up pin replacing head holding portion in the second embodiment.
Figure 59:
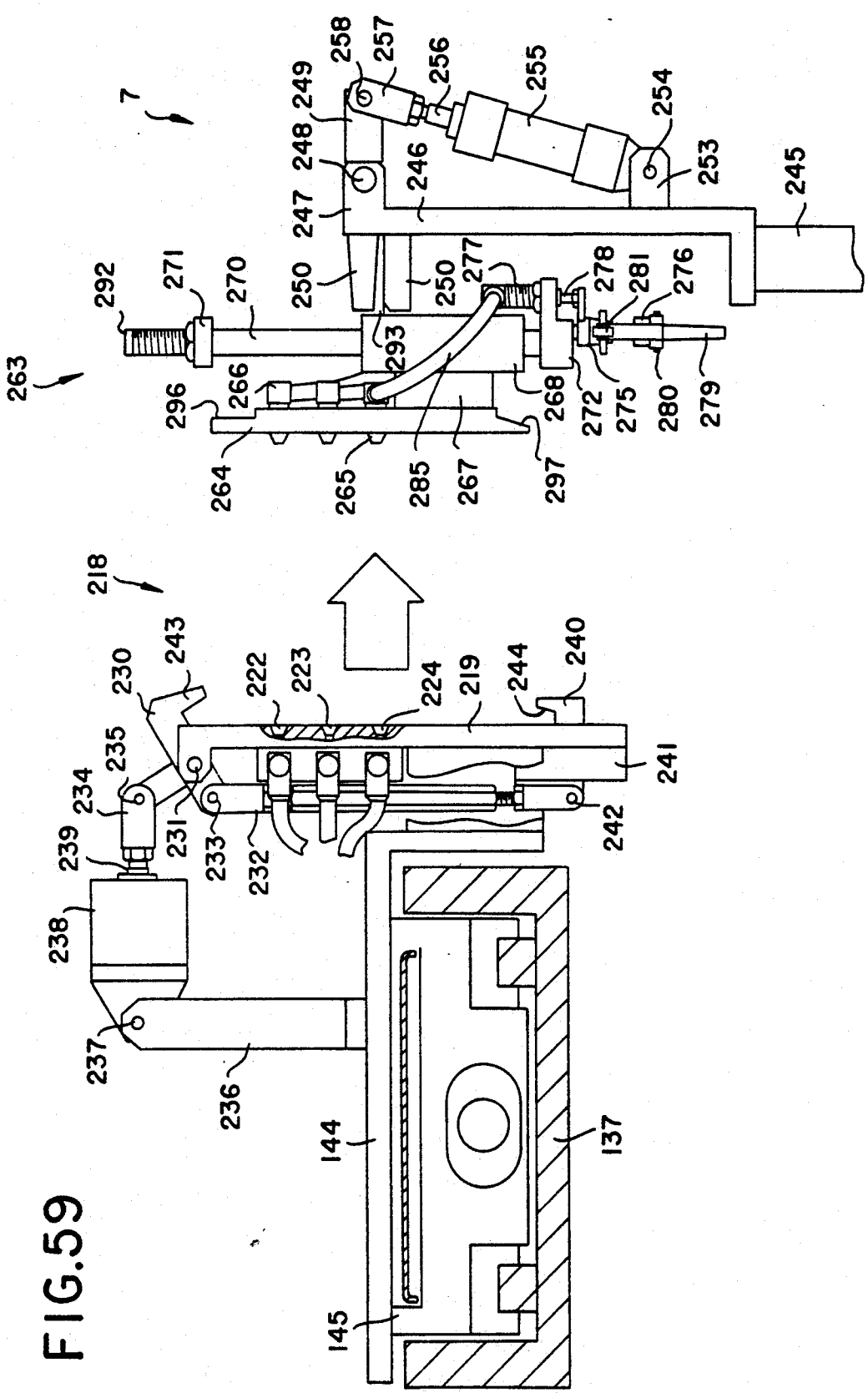
FIGS. 59 to 61 are side elevational view showing a series of operations in which the working head portion mounts the back-up pin replacing head in the second embodiment.

Nipples 227 are respectively screwed into openings of the ports 226 on the opposite end, which are connected to a solenoid valve (not shown) through air hoses 228. Back-up pin mounting head holding means are arranged in the upper and lower parts of the base 219. The reference numeral 230 designates a clamper which constitutes the upper holding means. The clamper 230 is in an inverted T shape as shown in FIG. 50, which is fitted in a grooved portion between a pair of bearing portions 229 formed in the upper part of the base 219. A supporting shaft 231 penetrates the clamper 230 and the bearing portions 229 on both its sides to connect them. One end of a connecting rod 232 is connected to an arm, which extends to the rear side of the mounting head 152, of the clamper 230 through a knuckle pin 233. The other arm, which is projected on the front, of the clamper 230 has its upper end bent downward. This bent portion has an engaging surface 243 engaged with the back-up pin mounting head on its inner surface. The reference numeral 238 designates an air cylinder which is rotatably supported on a bracket 236 fixed to the upper surface of the deck 144 through a knuckle pin 237. a joint 234 is attached to a slide rod 239 of the air cylinder 238, which is connected to an arm at the center of the clamper 230 by a knuckle pin 235. The reference numeral 240 designates a clamper arranged in the lower part of the base 219, which is sandwiched between a pair of guide rails 241 and is slidable up and down. The other end of the connecting rod 232 is connected to one end of the clamper 240 through a knuckle pin 242. The other end of the clamper 240 is bent upward and is provided with a slope. This slope is an engaging surface 244 engaged with the back-up pin mounting head. When the air cylinder 238 pushes the slide rod 239 out, the clamper 230 is rotated in a clockwise direction in FIG. 59. The connecting rod 232 is correspondingly pulled up so that the clamper 240 is raised.

Figure 52:
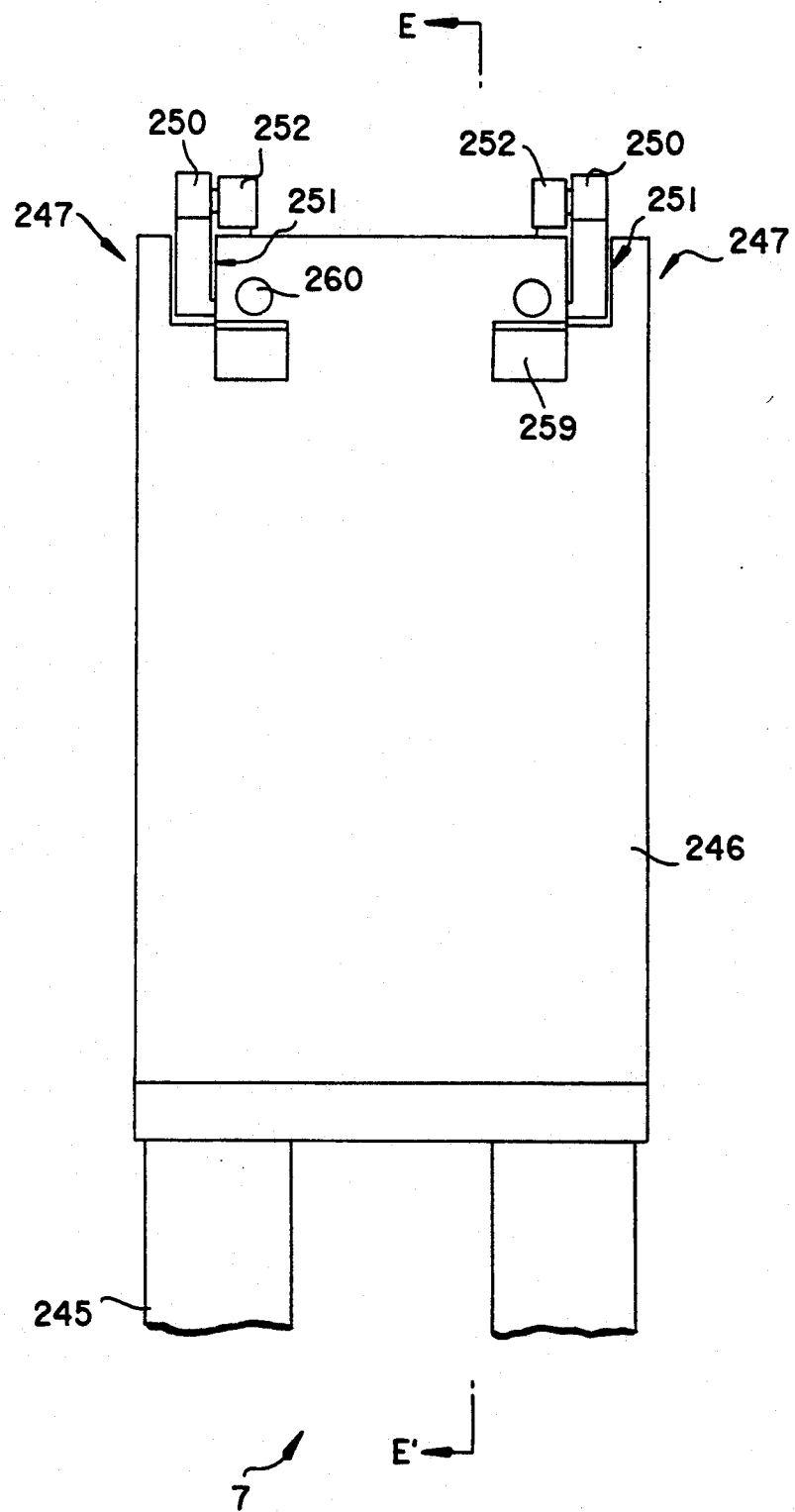
FIG. 52 is a front view showing a structure of a back-up pin replacing head stocker of the second embodiment.
Figure 54:
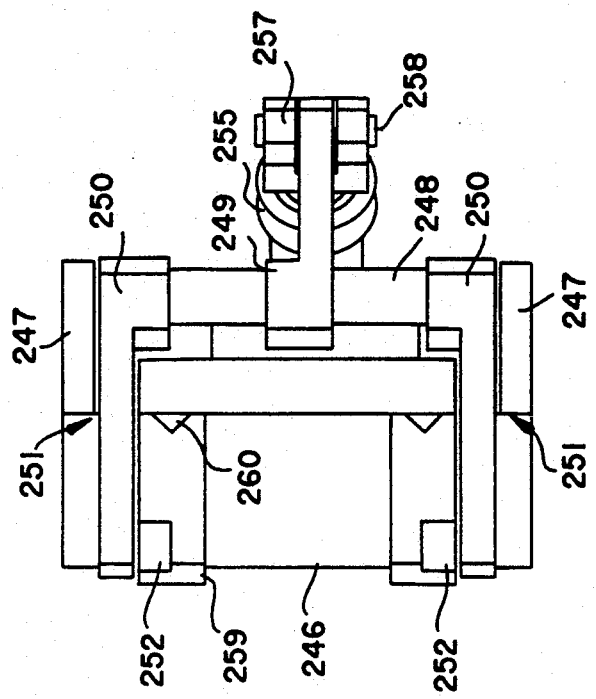
FIG. 54 is a top view showing the structure of the back-up pin replacing head stocker.
Figure 53:
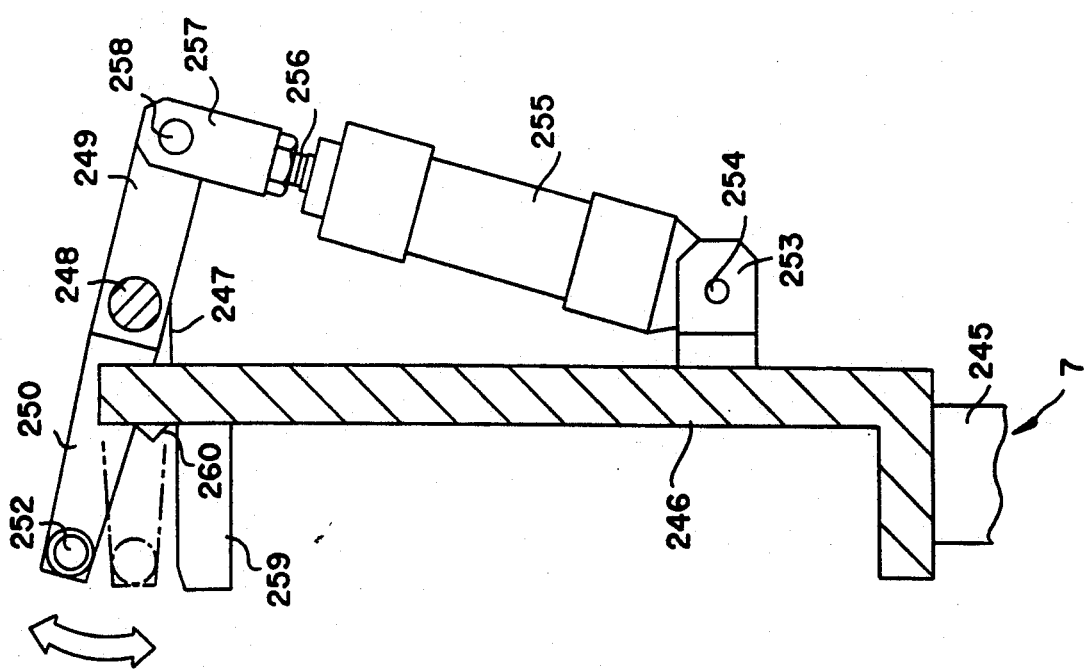
FIG. 53 is a cross sectional view taken along a line E—E' shown in FIG. 52.

Description is now made of a structure of the stocker 107 with reference to FIGS. 52 to 54. The stocker 107 stores the back-up pin mounting head until the back-up pins are replaced. The stocker 107 has its base 246 supported by two posts 245 extending from the main frame. A pair of bearings 247 is formed in the upper part of the base 246. Both ends of a supporting shaft 248 are fitted to the bearings 247. A lever 249 is mounted in the vicinity of the center of the supporting shaft 248, and a pair of clampers 250 is mounted on both sides thereof. A part of the clamper 250 is fitted in a groove 251 provided inside of the bearing 247. The reference numeral 252 designates a roller which is attached to one end of the clamper 250. The reference numeral 253 designates a bracket fixed to the base 246, which supports an air cylinder 255 through a pin 154. A joint 257 is screwed into a slide rod 256 of the air cylinder 255. One end of the lever 249 is fitted in a forked portion of the joint 257. The lever 249 is connected to the joint 257 through a knuckle pin 258. If the air cylinder 255 pushes the slide rod 256 out, the roller 252 of the clamper 250 can be lowered. The reference numeral 260 designates a conical projection for positioning the back-up pin mounting head.

Figure 55:
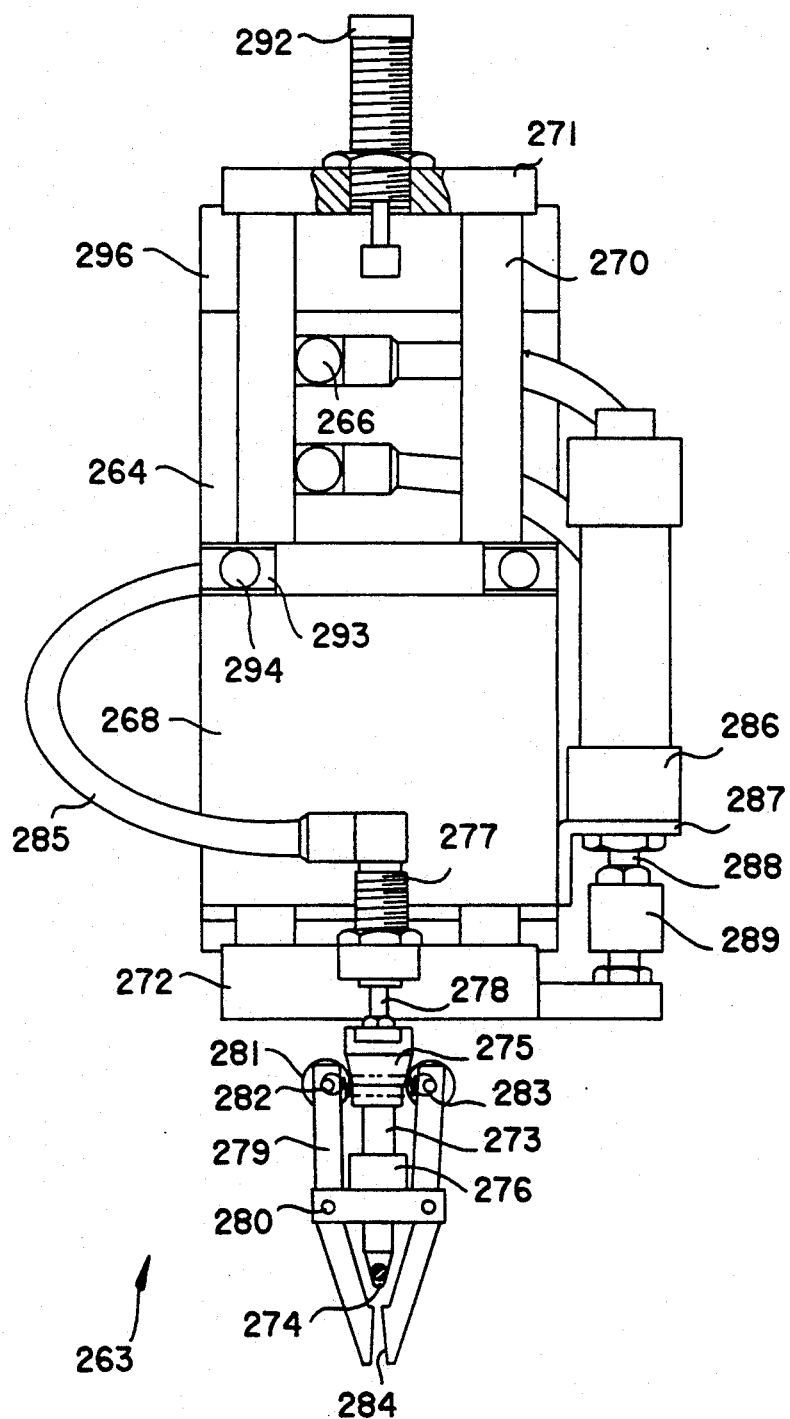
FIG. 55 is a front view showing a structure of a back-up pin replacing head of the second embodiment.
Figure 56:
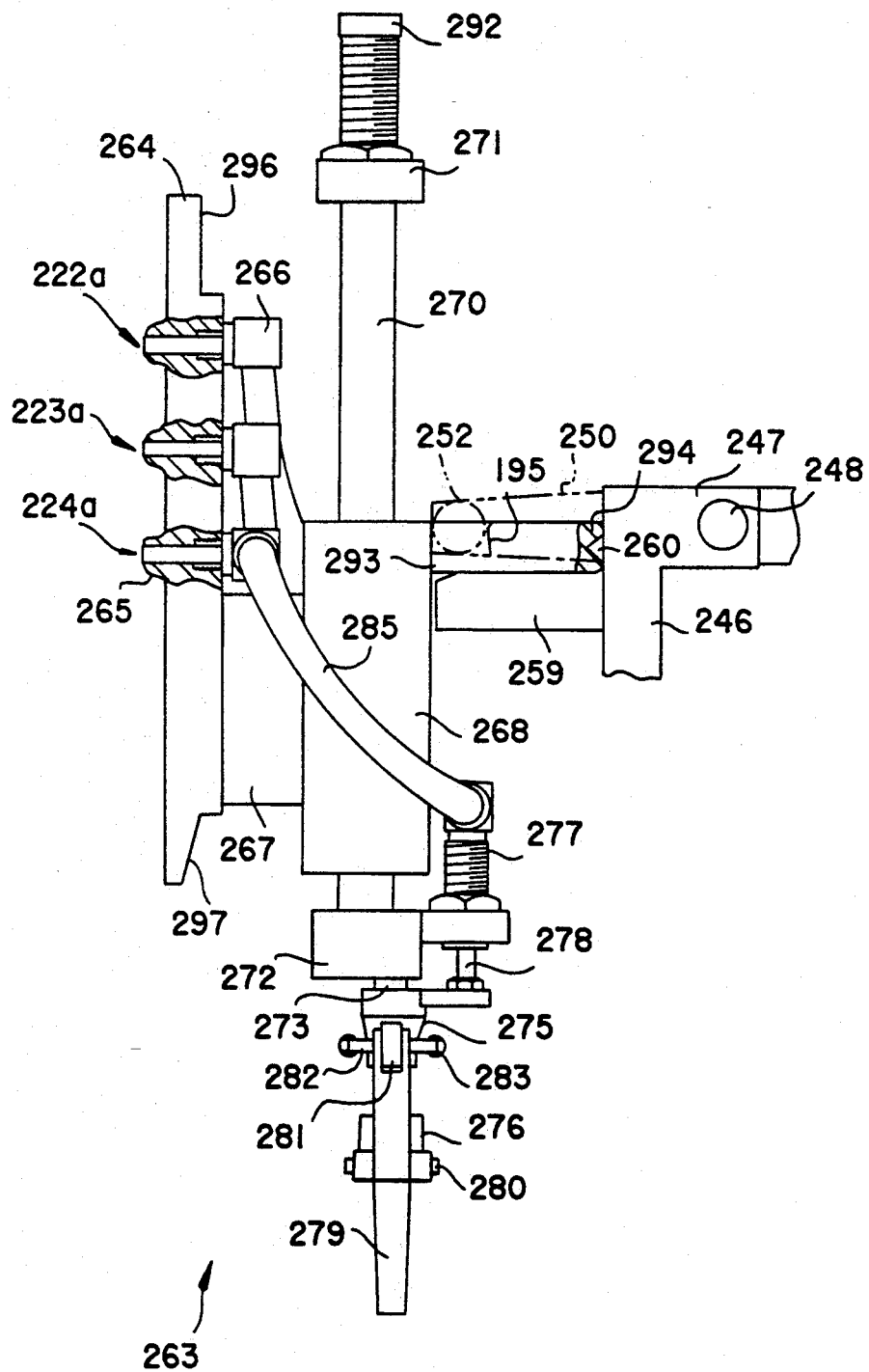
FIG. 56 is a side elevational view showing the structure of the back-up pin replacing head.
Figure 57:
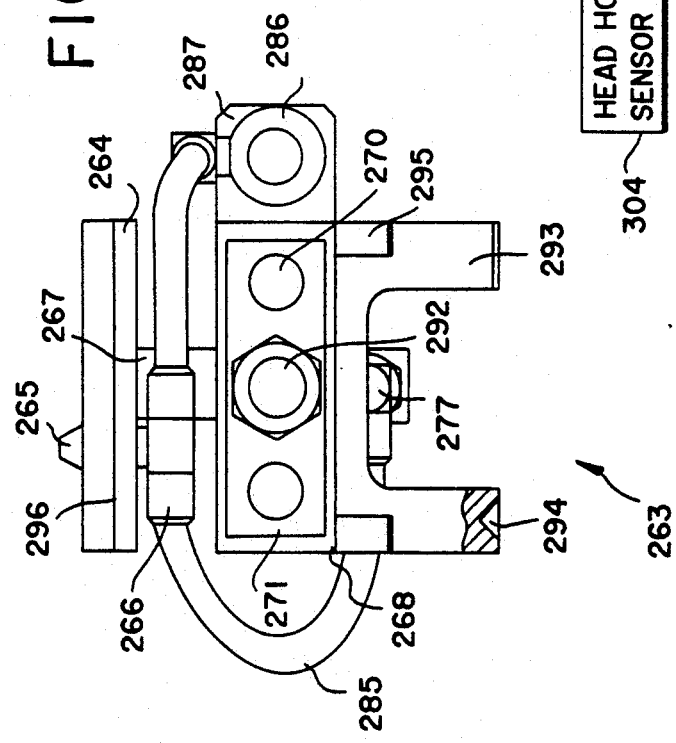
FIG. 57 is a top view showing the structure of the back-up pin replacing head.
Figure 60:
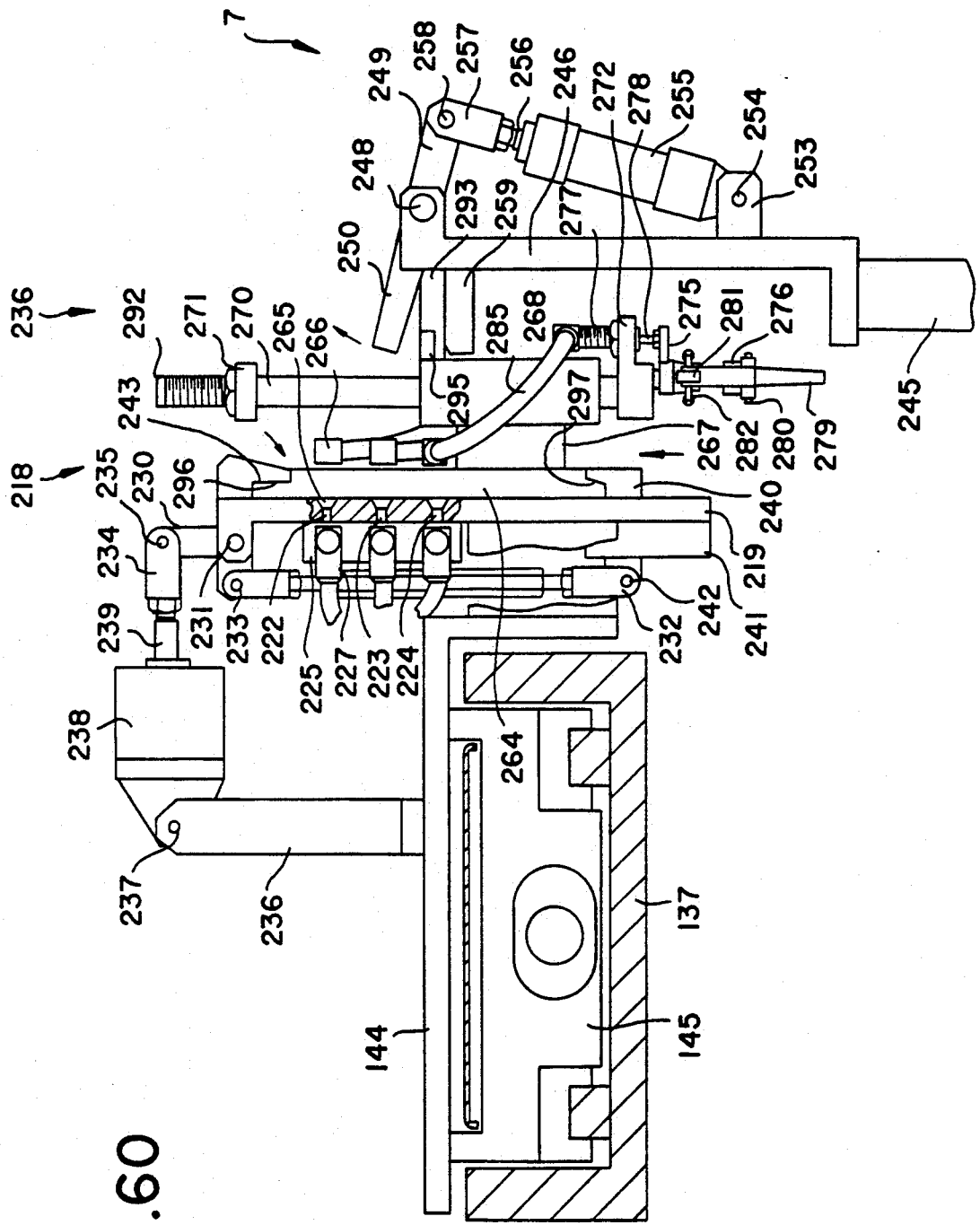

Description is now made of a structure of the back-up pin mounting head with reference to FIG. 55 to 57. A back-up pin mounting head (referred to as B/P mounting head hereinafter) 263 is mainly composed of a base 264. The B/P mounting head 263 is similar to the back-up pin replacing unit 73 of the first embodiment. The base 264 is provided with convex portions 265 fitted to tapered portions of the ports 222, 223 and 224 in the base 219 at the time of making the connection to the above described holding portion 218. Ports 222a, 223a and 224a connected to the ports 222, 223 and 224 are respectively formed in the convex portions 265. Nipples 266 are screwed into openings of the ports 222a, 223a and 224a on the opposite side of the convex portions 265. Stepped portions 296 and 297 are respectively formed in the upper and lower parts of the base 264. At the time of making the connection between the B/P mounting head 263 and the holding portion 218, the engaging surface 243 of the clamper 230 abuts on the stepped portion 296 and engaging surface 244 of the clamper 240 is joined to the stepped portion 297 to be a slope.

The reference numeral 267 designates a case supporting plate projected from the base 264, which supports a bearing case 268. A bearing (not shown) is mounted on the bearing case 268, to which a pair of vertical guide posts 270 is fitted. A connecting plate 271 is fixed to the upper ends of the guide posts 270 and a chuck base 272 which is similar to the silky chuck 76 of the first embodiment is fixed to the lower end thereof. The reference numeral 273 designates a vertical post having its upper part mounted on the chuck base 272, which has a concave portion 274 for receiving the upper end of the back-up pin 122 formed in its lower end. A slide cam 275 having a surface tapered downward is fitted to the post 273 slidably in an axial direction and a claw supporting block 276 is mounted below the slide cam 275. A slide rod 278 of an air cylinder 277 fixed to the chuck base 272 is connected to the slide cam 275. A pair of forked portions are symmetrically projected outward from the claw supporting block 276.

A pair of pin holding claws 279 which are similar to the chuck claw 80 and 81 of the first embodiment are fitted in the pair of forked portions and is supported by a pin 280 so as to be rotatable within a vertical surface. A roller 281 is fitted in a forked portion formed in the upper part of the pin holding claw 279. A hook pin 282 penetrates both the pin holding claw 279 and the roller 281 to connect them. The reference numeral 283 designates a coil spring which has both its ends connected to opposite ends of the hook pin 282. Accordingly, the lower ends of the pin holding claw 279 are always urged in the opening direction. The roller 281 is urged by the coil spring 283, to be pressed against a cam surface of the slide cam 275. A V-shaped groove is cut in the vertical direction in a supporting portion 284 in the lower part of the pin holding claw 279.

The reference numeral 285 designates an air hose which has its one end connected to the air cylinder 277. The other end of the air hose 285 is connected to the nipple screwed into the port 224a. The reference numeral 286 designates an air cylinder which is attached to the bearing case 268 through a bracket 287. A slide rod 288 of the air cylinder 286 is connected to the chuck base 272 through a joint 289. The air cylinder 286 is connected to the nipples 266 screwed into the ports 222a and 223a through air hoses 290 and 291. The reference numeral 292 designates a shock absorber which is screwed into the center of the connecting plate 271.

The reference numeral 293 designates a connecting arm to the stocker 107, which is projected in the direction of the front from the upper part of the bearing case 268. A concave portion 294 is formed in an end of the connecting arm 293 and a concave portion 295 is also formed in the root portion thereof (see FIG. 57). The B/P mounting head 263 and the stocker 107 are connected to each other by putting the connecting arm 293 on the rail 259 as well as causing the convex portion 294 of the connecting arm 293 to conform to the projection 260 of the stocker 7 and engaging the roller 252 of the clamper 250 with the concave portion 295 of the connecting arm 293 (see FIG. 56).

Figure 58:
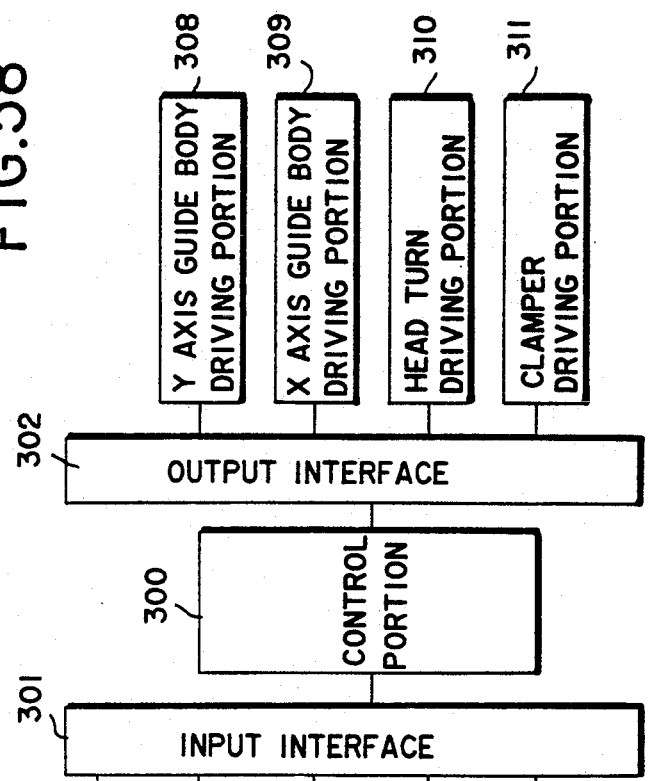
FIG. 58 is a block diagram showing the second embodiment.

FIG. 58 shows the connecting conditions of components. The reference numeral 300 designates a control portion for processing data sent from components on the input side through an input interface 301 and issuing instructions to components on the output side through an output interface 302. The control portion 300 includes a CPU, RAM and etc. similar to the CPU 97 and RAM 98 of the first embodiment. The components on the input side comprise an input portion 303 for inputting, for example, an arrangement program of the back-up pin 122 and a program of the mounting portion of an electronic part, a head holding sensing sensor 304 for sensing that the B/P mounting head 263 is reliably held in the stocker 107, a parts absorption sensing sensor 305 for sensing that the mounting head 152 absorbs electronic parts, a running-out-of-parts sensing sensor 305 for sensing that parts in the parts feeding unit 106 are run out of, and a back-up pin holding sensing sensor 307 for sensing that the B/P mounting head 263 holds the back-up pin 122. The input portion 303 is similar to the operation portion 99 of the first embodiment. The components on the output side comprise, for example, a Y-axis guide body driving portion 308 for controlling an operation of the moving block 139, an X-axis guide body driving portion 309 for controlling an operation of the moving block 145, a head turn driving portion 310 for controlling an operation of the pulse motor 188, a clamper driving portion 311 for controlling an operation of the air cylinder 238. Other types of components such as an air cylinder and a valve are also controlled by the control portion 290.

Description is now made of a mounting operation of the B/P mounting head 263 in the holding portion 218 and a replacing operation of the back-up pin 122 in the B/P mounting head 263 with reference to FIGS. 59 to 64. It is assumed that the mounting portion 150 performs the parts mounting work using the working head 152 (the mounting head 152 is not illustrated for easy seeing in FIGS. 59 to 64). The stocker 107 holds the B/P mounting head 263.

When the necessity of changing the position of the back-up pin 22 arises due to the change in the type of board, a worker depresses a type replacing switch arranged in the input portion 303. Then the parts mounting unit 6 stops mounting of parts, to move the working portion 150 toward the stocker 107 (see FIG. 59). The working portion 150 is moved until the base 219 in the holding portion 218 comes into contact with the base 264 in the B/P mounting head 263, to be stopped. At this time, the convex portions 265 formed in the base 264 in the B/P mounting head 263 are fitted to the ports 222, 223 and 224 in the holding portion 218. The air cylinder 238 in the holding portion 218 then pushes the slide rod 239 out, to drive the clampers 230 and 240. The clamper 230 is rotated in a clockwise direction, to cause the engaging surface 243 to abut on the stepped portion 296 of the base 264 in the B/P mounting head 263 and at the same time, the clamper 470 is pulled upward, to join the engaging surface 244 to the stepped portion 297 of the base 264. Thus, the connection between the mounting portion 150 and the B/P mounting head 263 is completed. At the time point where the B/P mounting head 263 and the holding portion 218 are connected to each other, the ports 222, 223 and 224 are completely connected to the ports 222a, 223a and 224a, respectively, so that the air cylinders 277 and 286 in the B/P mounting head 263 can be driven by an operation of a solenoid value (not shown). At the same time, the air cylinder 255 rotates the clamper 250, to release the B/P mounting head 263 from the stocker 107 (see FIG. 60).

Figure 61:
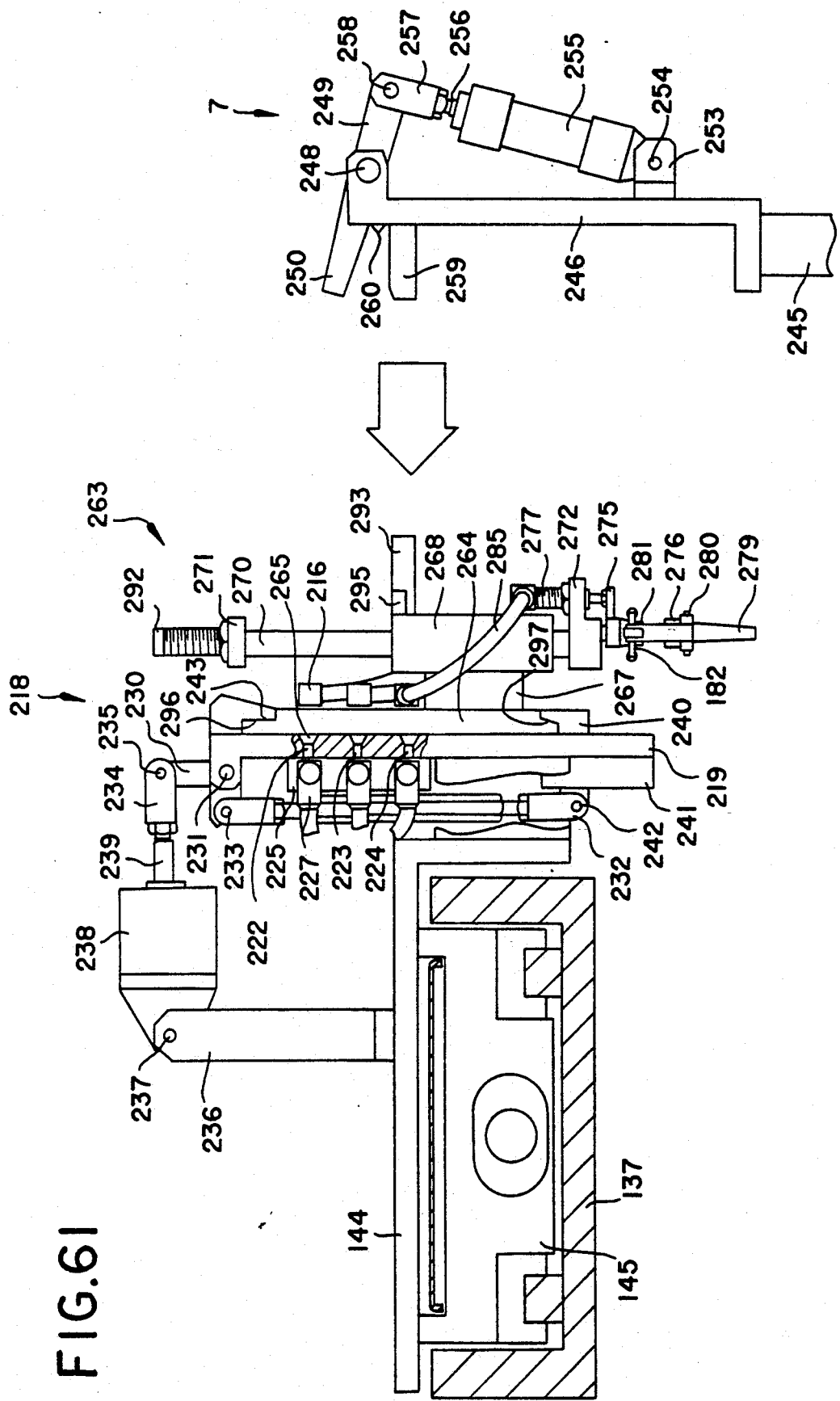
Figure 62:
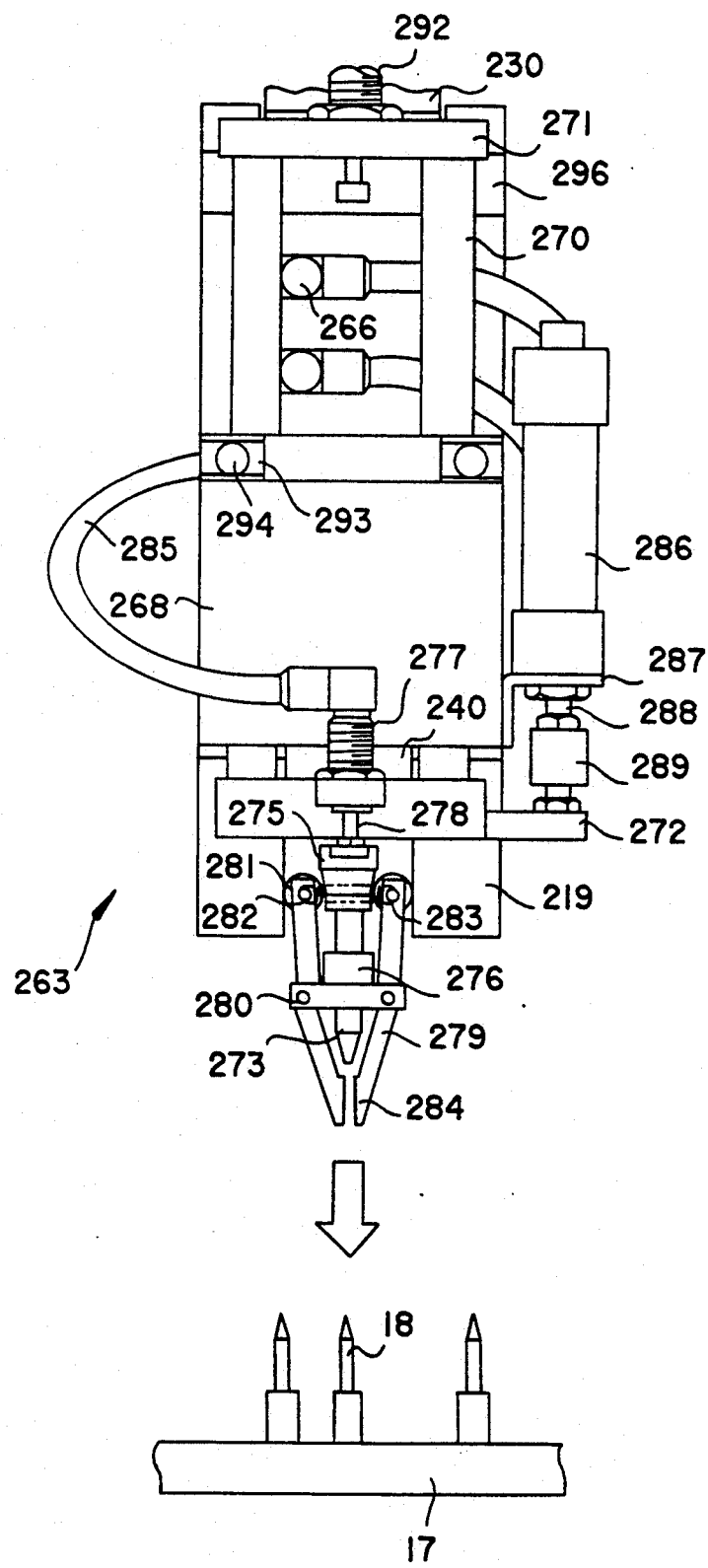
FIGS. 62 to 64 are front views showing a series of operations in which the back-up pin replacing head replaces a back-up pin in the second embodiment.
Figure 63:
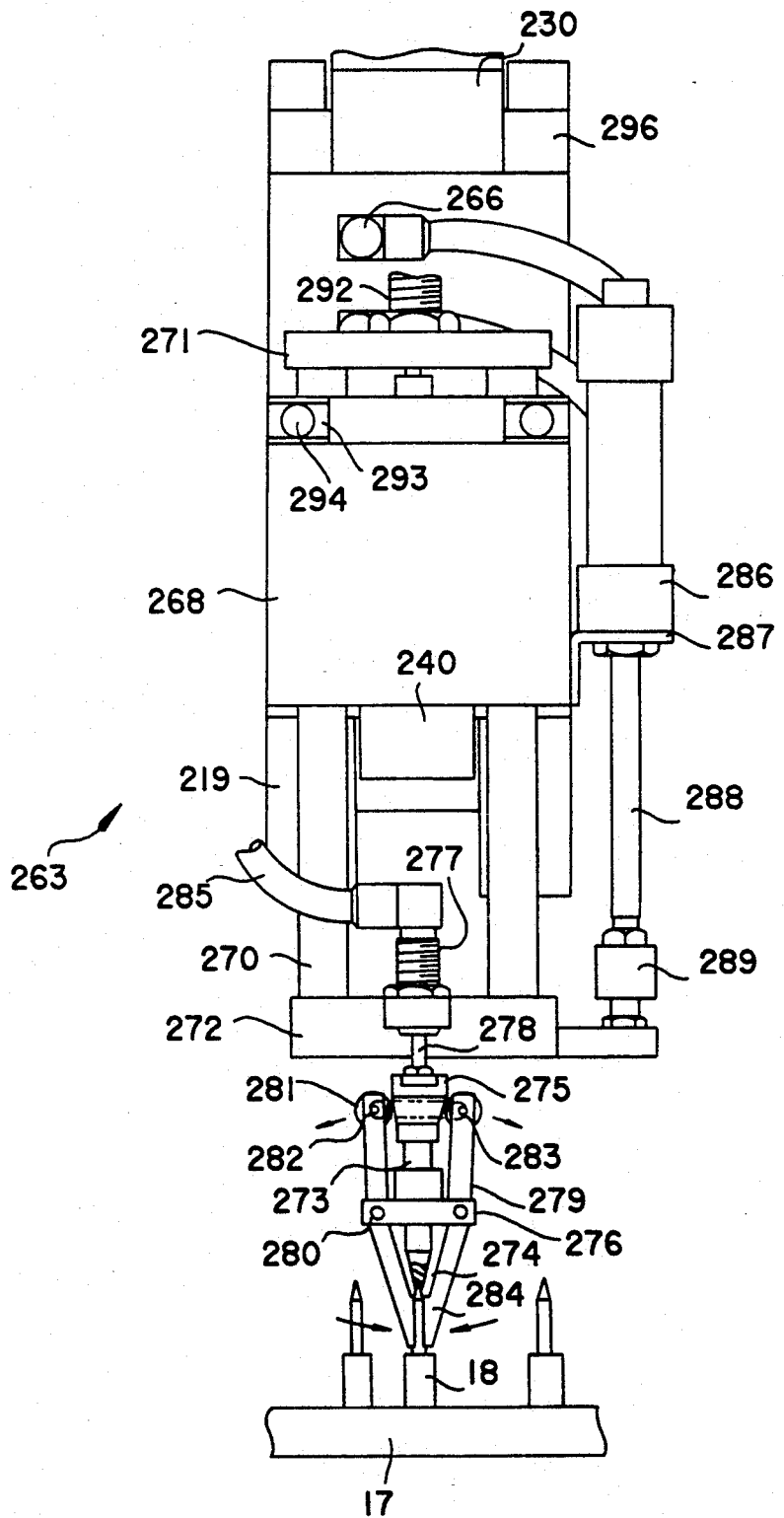
Figure 64:
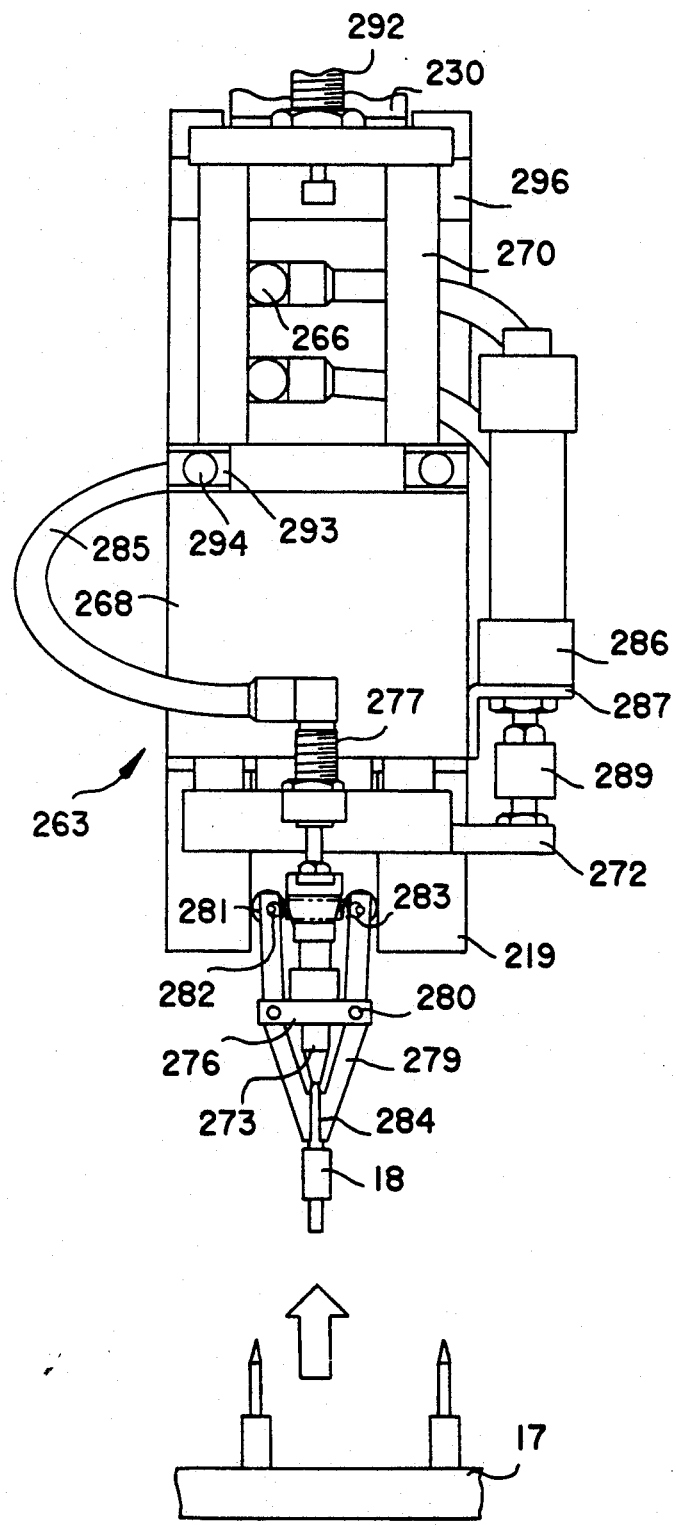

When mounting of the B/P mounting head 263 is completed, the working portion 150 begins to perform the replacing work of the back-up pin 122 (see FIG. 61). The working portion 150 positions the B/P mounting head 263 directly over a desired back-up pin 122. The air cylinder 286 pulls the slide rod 288 into it, to raise the chuck base 272. The air cylinder 277 is also in a state where it pulls the slide rod 278 into it. The roller 281 of the pin holding claw 279 is in contact with a tapered portion of the slide cam 275. On this occasion, the pin holding claw 279 is opened to the extent that a V-shaped groove in the supporting portion 284 does not come into contact with a small diameter portion of the back-up pin 122 (see FIG. 62). The air cylinder 286 pushes the slide rod 288 out, to push the chuck base 272 down until the concave portion 247 of the post 273 is completely engaged with the upper end of the back-up pin 122.

Thereafter, the air cylinder 77 pushes the slide rod 278 out, to lower the slide cam 275. The roller 281 of the pin holding claw 279 is rolled along the cam surface of the slide cam 275, to expand the upper part of the pin holding claw 279 outward. Thus, the supporting portion 284 holds the back-up pin 18 (see FIG. 63). If the air cylinder 286 pulls the slide rod 288 into it in this state, the back-up pin 122 is pulled out of the back-up pin base 17 (see FIG. 64).

Thereafter, this working portion 150 moves the B/P mounting head 263 to a position above a desired throughhole 121. After the B/P mounting head 263 is stopped, the working portion 150 lowers the chuck base 272 again, to insert the back-up pin 122 into the throughhole 121. The back-up pins 122 which remain on the back-up pin base 120 are moved to the up-and-down base 129 (the up-and-down base 129 is raised to the same height as that of the back-up pin base 120). When the number of back-up pins is insufficient on the side of the back-up pin base 120, on the other hand, the back-up pins 122 are pulled out of the up-and-down base 129 and are moved to the back-up pin base 120.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A circuit board assembling apparatus, comprising:
    a supporting table on which back-up pins for supporting a printed circuit board are disposed;
    a stocker for vertically storing spare back-up pins being not used;
    a replacing unit movable between said supporting table and said stocker for changing the arrangement of the back-up pins disposed in a first pattern on said supporting table to a second pattern by changing locations of back-up pins disposed in said first pattern on said supporting table or stored by said stocker in accordance with the type of a printed circuit board to be supported, and
    parts mounting means associated with said replacing unit, for mounting electronic parts onto said printed circuit board supported by said back-up pins.

2. An assembling apparatus in accordance with claim 1, further comprising parts mounting means for mounting electronic parts onto said printed circuit board supported by said back-up pins, wherein said replacing unit is attached to said parts mounting means.

3. An assembling apparatus in accordance with claim 2, further comprising a first moving means for moving said replacing unit together with said parts mounting means.

4. An assembling apparatus in accordance with claim 3, wherein said first moving means moves said replacing unit and said parts mounting means in one direction of X and Y directions, further comprising second moving means for moving said supporting table in the other direction of said X and Y directions.

5. An assembling apparatus in accordance with claim 3, further comprising a movable chute movable in accordance with a width of a printed circuit board to be processed, and a photosensor provided on said movable chute for sensing obstacles.

6. An assembling apparatus in accordance with claim 3, further comprising changing means for changing said replacing means.

7. A circuit board assembling apparatus in accordance with claim 3, further comprising:
    a pair of chutes for guiding a printed circuit board, said pair of chutes including at least one movable chute so that an interval between said pair of chutes can be changed in accordance with a width of the printed circuit board;
    detecting means provided on said at least one movable chute for detecting obstacles on said supporting table; and
    controlling means responsive to detection of the obstacles by said detecting means for controlling a driving source for moving said at least one movable chute to stop movement of said at least one movable chute.

8. A circuit board assembling apparatus, comprising:
    a supporting table on which back-up pins for supporting a printed circuit board are disposed;
    a stocker for vertically storing spare back-up pins being not used;
    a replacing unit movable between said supporting table and said stocker for changing the arrangement of the back-up pins disposed in a first pattern on said supporting table to a second pattern by changing locations of back-up pins disposed in said first pattern on said supporting table or stored by said stocker in accordance with the type of a printed circuit board to be supported; and
    adhesive dispensing means associated with said replacing unit for dispensing adhesive onto said printed circuit board supported by said back-up pins.

9. A circuit board assembling apparatus, comprising:
    a supporting table on which back-up pins for supporting a printed circuit board are disposed;
    a stocker for vertically storing spare back-up pins being not used, said stocker being provided at a location which is separate from said supporting table;
    a replacing unit movable between said supporting table and said stocker for changing the arrangement of the back-up pins disposed in a first pattern on said supporting table to a second pattern by changing locations of back-up pins disposed in said first pattern on said supporting table or stored by said stocker in accordance with the type of a printed circuit board to be supported, said replacing unit being movable on a horizontal plane with respect to said table and said stocker, and,
    parts mounting means associated with said replacing unit, for mounting electronic parts onto said printed circuit board supported by said back-up pins.

* * * * *